(12) United States Patent
Juergens

(10) Patent No.: US 9,036,129 B2
(45) Date of Patent: May 19, 2015

(54) PROJECTION EXPOSURE METHOD, SYSTEM AND OBJECTIVE

(71) Applicant: Carl Zeiss SMT Gmbh, Oberkochen (DE)

(72) Inventor: Dirk Juergens, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 14/496,933

(22) Filed: Sep. 25, 2014

(65) Prior Publication Data

US 2015/0049320 A1 Feb. 19, 2015

Related U.S. Application Data

(63) Continuation of application No. 12/699,529, filed on Feb. 3, 2010, now Pat. No. 8,873,022.

(30) Foreign Application Priority Data

Feb. 12, 2009 (EP) ..................................... 09001938

(51) Int. Cl.
*G03B 27/52* (2006.01)
*G03B 27/42* (2006.01)
*G03F 7/20* (2006.01)

(52) U.S. Cl.
CPC .................. *G03F 7/70058* (2013.01)

(58) Field of Classification Search
CPC . G03F 7/70258; G03F 7/706; G03F 7/70266; G03F 7/70641; G03F 7/0308
USPC .............................. 355/55, 53, 67
See application file for complete search history.

(56) References Cited

U.S. PATENT DOCUMENTS

| | | | |
|---|---|---|---|
| 4,226,507 A | 10/1980 | Fuschetto | |
| 4,647,164 A | 3/1987 | Sawicki et al. | |
| 6,338,823 B1 | 1/2002 | Furukawa | |
| 6,674,510 B1 | 1/2004 | Jasper et al. | |

(Continued)

FOREIGN PATENT DOCUMENTS

| | | |
|---|---|---|
| CN | 1910494 A | 2/2007 |
| DE | 10 2006 024 810 | 11/2007 |

(Continued)

OTHER PUBLICATIONS

Kidger, "Fundamental Optical Design", SPIE Press, Bellingham, Washington, USA (Chapter 2).

(Continued)

*Primary Examiner* — Peter B Kim
(74) *Attorney, Agent, or Firm* — Fish & Richardson P.C.

(57) ABSTRACT

A projection exposure method includes exposing an exposure area of a radiation sensitive substrate with at least one image of a pattern of a mask in a scanning operation. The scanning operation includes moving the mask relative to an effective object field of the projection objective and simultaneously moving the substrate relative to an effective image field of the projection objective in respective scanning directions. The projection exposure method also includes changing imaging properties of the projection objective actively during the scanning operation according to a given time profile to change dynamically at least one aberration of the projection objective between a beginning and an end of the scanning operation.

20 Claims, 15 Drawing Sheets

(56) References Cited

U.S. PATENT DOCUMENTS

| | | |
|---|---|---|
| 6,813,001 B2 | 11/2004 | Fujisawa et al. |
| 6,844,994 B2 | 1/2005 | Melzer et al. |
| 7,184,124 B2 | 2/2007 | Harned et al. |
| 7,385,756 B2 | 6/2008 | Shafer et al. |
| 2002/0048096 A1 | 4/2002 | Melzer et al. |
| 2003/0090640 A1 | 5/2003 | Fujisawa et al. |
| 2003/0133087 A1 | 7/2003 | Shima |
| 2003/0234918 A1 | 12/2003 | Watson |
| 2004/0036940 A1 | 2/2004 | Hazelton et al. |
| 2005/0280910 A1 | 12/2005 | Fehr et al. |
| 2006/0023179 A1 | 2/2006 | Tschischgale et al. |
| 2006/0092393 A1 | 5/2006 | Harned et al. |
| 2006/0232866 A1 | 10/2006 | Sai et al. |
| 2006/0256314 A1 | 11/2006 | Nolscher et al. |
| 2008/0055740 A1 | 3/2008 | Wagner et al. |
| 2008/0106711 A1 | 5/2008 | Beierl et al. |
| 2008/0174858 A1 | 7/2008 | Feldmann et al. |
| 2009/0042115 A1 | 2/2009 | Inoue et al. |
| 2009/0042139 A1 | 2/2009 | Shiraishi et al. |
| 2009/0090640 A1 | 4/2009 | Jang et al. |
| 2010/0027143 A1 | 2/2010 | Angel |

FOREIGN PATENT DOCUMENTS

| | | |
|---|---|---|
| EP | 0 961 149 | 12/1999 |
| EP | 0 660 169 | 4/2000 |
| EP | 1 376 192 | 1/2004 |
| EP | 0 851 304 B1 | 3/2004 |
| JP | 11-045846 | 2/1999 |
| JP | 2002-037545 | 2/2002 |
| JP | 2002-189193 | 7/2002 |
| JP | 2003-142373 | 5/2003 |
| JP | 2004-056125 | 2/2004 |
| JP | 2006-054453 | 2/2006 |
| JP | 2006-128699 | 5/2006 |
| JP | 2008-263193 | 10/2008 |
| WO | WO 99/32940 | 7/1999 |
| WO | WO 02/37545 | 5/2002 |
| WO | WO 03/098350 | 11/2003 |
| WO | WO 2006/013100 | 2/2006 |
| WO | WO 2006/053751 | 10/2006 |
| WO | WO 2008/034636 | 3/2008 |
| WO | WO 2008/126925 | 10/2008 |
| WO | WO 2008/126926 | 10/2008 |
| WO | WO 2008/146933 | 12/2008 |
| WO | WO 2009/018911 | 2/2009 |

OTHER PUBLICATIONS van Zeijl et al., "Lithographic Alignment Offset Compensation for Substrate Transfer Process," Proc. STW/SAFE, Veldhoven, The Netherlands, 2005, pp. 121-126.

Handbook of Optical Systems: vol. 2, Physical Image Formation, ed. By H Gross, Wiley-VCH Verlag GmbH & Co. KgaA, Chapter 20.2, (2005).

International Technology Road Map for Semiconductors: 2006 Update, Table 67a (43 pages).

Japanese Office Action, with English translation, for corresponding JP Appl. No. 2010-047084, dated Mar. 23, 2012.

European Search Report for corresponding for the corresponding EP Application No. 09001938.1, dated Jul. 14, 2009.

Japanese Office Action, with translation thereof, for corresponding JP Appl No. 2010-047084, dated May 30, 2013.

Copy of Taiwanese Office Action, with translation thereof, for TW Appl No. 099104346, dated Dec. 15, 2014.

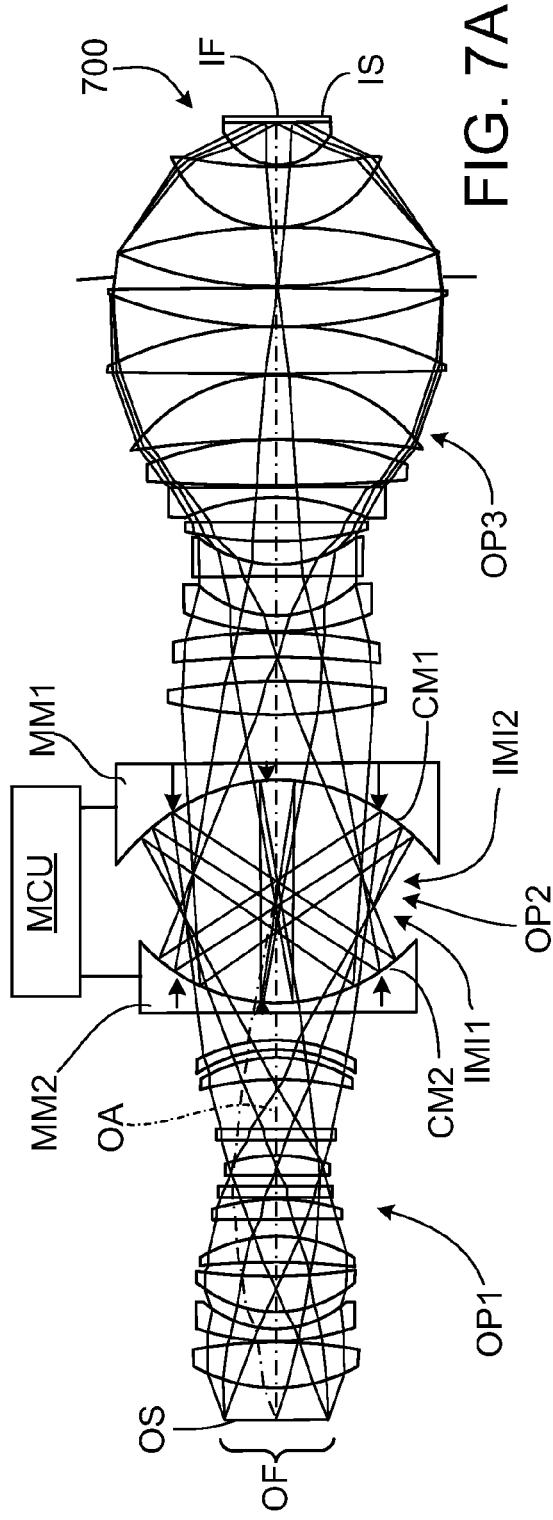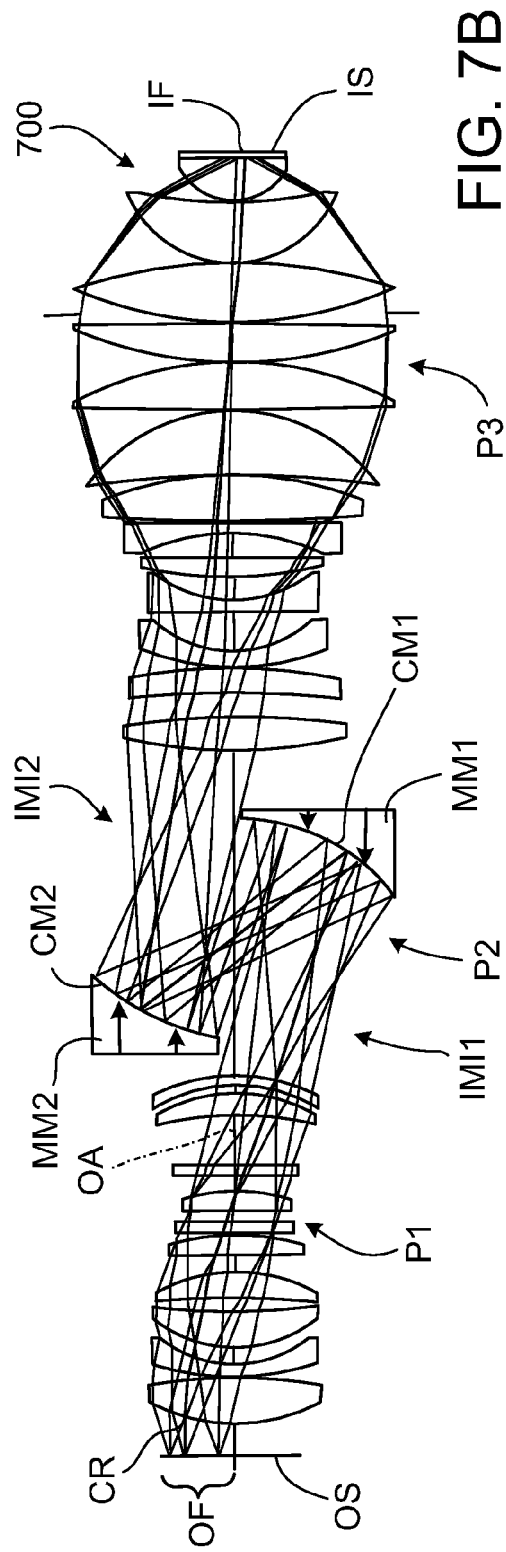
FIG. 7A
FIG. 7B

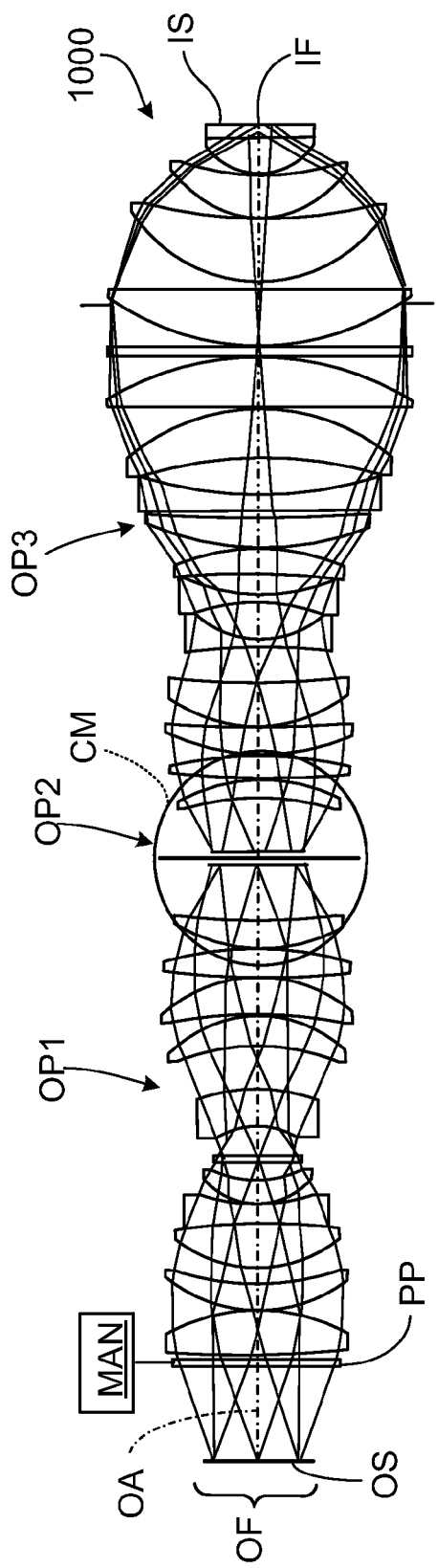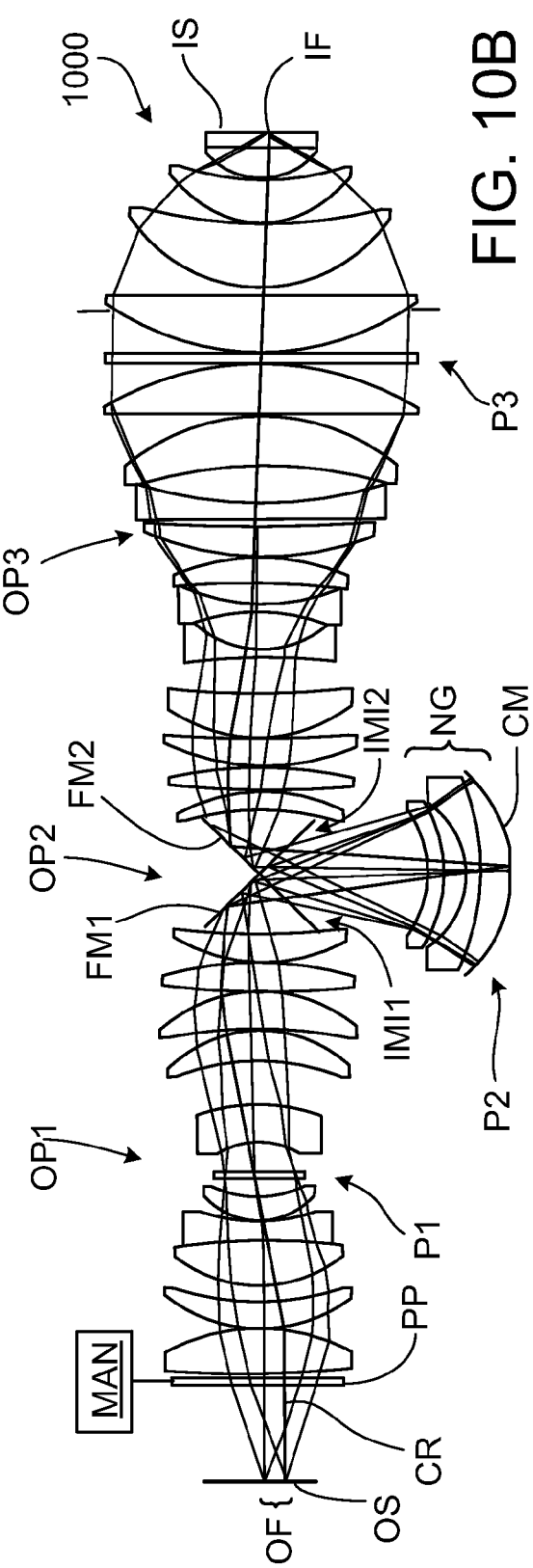

PROJECTION EXPOSURE METHOD, SYSTEM AND OBJECTIVE

CROSS-REFERENCE TO RELATED APPLICATIONS

This application is a continuation of, and claims priority under 35 USC 120 to, U.S. application Ser. No. 12/699,529, filed Feb. 3, 2010, now U.S. Pat. No. 8,873,022, which claims priority under 35 U.S.C. §119 to European Patent Application EP 09001938.1, filed Feb. 12, 2009. The contents of these applications are hereby incorporated by reference in their entirety.

FIELD

The disclosure relates to a projection exposure method for exposing a radiation-sensitive substrate, arranged in the region of an image surface of a projection objective, with at least one image of a pattern of a mask arranged in the region of an object surface of the projection objective. The disclosure further relates to a projection exposure system suitable for carrying out the method, and to a projection objective suitable to be used in such a projection exposure system.

BACKGROUND

Microlithographic projection exposure methods and systems are currently used to fabricate semiconductor components and other finely patterned components. A microlithographic exposure process involves using a mask (reticle) that carries or forms a pattern of a structure to be imaged. The pattern is positioned in a projection exposure system between an illumination system and a projection objective in a region of the object surface of the projection objective. Primary radiation is provided by a primary radiation source and transformed by optical components of the illumination system to produce illumination radiation directed at the pattern of the mask in an illuminated field. The radiation modified by the mask and the pattern passes through the projection objective, which forms an image of the pattern in the image surface of the projection objective, where a substrate to be exposed is arranged. The substrate normally carries a radiation-sensitive layer (photoresist).

When a microlithographic projection exposure system is used in the manufacture of integrated circuits, the mask (reticle) may contain a circuit pattern corresponding to an individual layer of the integrated circuit. This pattern can be imaged onto an exposure area on a semiconductor wafer which serves as a substrate. The exposure area is sometimes referred to as a die. A die in the context of integrated circuits is a small block of semiconducting material, on which a given functional circuit is fabricated. A single wafer typically contains a large number of adjacent dies which are successively exposed to an image of the pattern.

In one class of microlithographic projection exposure systems each die is irradiated by exposing the entire pattern of the reticle onto the die at once. Such apparatuses are commonly referred to as wafer steppers.

In alternative exposure systems commonly referred to as step-and-scan apparatus or wafer scanner, each exposure area is irradiated progressively in a scanning operation by moving the mask relative to an illumination beam in an effective object field of the projection objective, and simultaneously moving the substrate relative to the projection beam in the conjugate effective image field of the projection objective in respective scanning directions. The mask is typically held in place by a mask holder, which is movable parallel to the object surface of the projection objective in a scanning apparatus. The substrate is typically held by a substrate holder, which is movable parallel to the image surface in a scanning apparatus. The scanning directions may be parallel to each other or anti-parallel to each other, for example. During the scanning operation, the speed of movement of the mask and the speed of movement of the substrate are interrelated via the magnification ratio $\beta$ of the projection objective, which is smaller than 1 for reduction projection objectives.

Forming a faithful image of a pattern on the substrate with sufficient contrast typically involves the substrate surface should lying in the focal region of the projection objective during exposure. More specifically, the substrate surface should be arranged in the region of the depth of focus (DOF) of the projection objective, which is proportional to the Rayleigh unit RU defined as $RU=\lambda/NA^2$, where X is the operating wavelength of the projection exposure system and NA is the image-side numerical aperture of the projection objective. Deep ultraviolet (DUV) lithography $\lambda=193$ nm, for example, typically involves a projection objective with a numerical aperture of 0.75 or higher to achieve 0.2 µm or smaller features. In this NA-region, the depth of focus is typically some tenth of a micrometer. In general, the depth of focus tends to decrease as the resolving power of the projection system is increased.

It has long been recognized that systems having relatively narrow depth of focus may involve special technical measures to ensure that the exposure area on the substrate is in focus during exposure.

Imaging errors may also be introduced as a result of gravity falses causing a mask shape to deviate from a planar shape. This effect is frequently referred to as "reticle bending".

SUMMARY

In some embodiments, the disclosure provides a step-and-scan projection exposure method which allows for high quality imaging on substrates having an uneven substrate surface.

In certain embodiments, the disclosure provides a step-and-scan projection exposure method which allows high quality imaging in cases where a pattern to be imaged is formed on an uneven mask surface.

In some embodiments, the disclosure provides a projection exposure method that includes exposing an exposure area of a radiation-sensitive substrate arranged in an image surface of a projection objective with at least one image of a pattern of a mask arranged in an object surface of the projection objective in a scanning operation. The scanning operation includes moving the mask relative to an effective object field of the projection objective and simultaneously moving the substrafe relative to an effective image field of the projection objective in respective scanning directions. The projection exposure method also includes changing imaging properties of the projection objective actively during the scanning operation according to a given time profile to change dynamically at least one aberration of the projection objective between a beginning and an end of the scanning operation. Changing at least one imaging property of the projection objective includes changing in a spatially resolving manner an optical effect caused by at least one field element of the projection objective. The field element includes at least one optical surface arranged in a projection beam path optically close to a field surface of the projection objective. At least one field element is a mirror having a reflective surface arranged in the projection beam path optically close to a field surface. Changing at least one imaging property of the projection objective includes changing optical properties of the mirror by changing a surface profile of the reflective surface of the mirror in an optically used area.

The inventors have recognized that conventional methods to ensure a focused imaging of fine structures onto a substrate may not be sufficient in all cases to ensure a high yield of properly exposed substrates and thereby to reduce the reject rate. Specifically, it has been recognized that the reject rate may significantly be influenced by a local unevenness (unflatness) of the substrate surface within the exposure area. If the relative position of the substrate surface within the exposure area varies across the exposure area in a magnitude beyond an acceptable range, parts of the pattern to be imaged within the exposure are may not be sufficiently defined in the structured component, thereby increasing the probability of component failure during the lifetime of the component.

The potential problem may be exemplified when considering, for example, that the depth of focus of projection systems typically designed to print images at the 45 nm node will typically have a depth of focus in the range between about 100 nm and about 150 nm Specifications published in the INTERNATIONAL TECHNOLOGY ROAD MAP FOR SEMICONDUCTORS: 2006 Update, Table 67a indicate that typical desired properties for the site flatness SFQR of wafer substrates within a 26 mm×8 mm exposure area of a scanner system may correspond to the associated DRAM ½ pitch value in direct random access memories (DRAM). For example, those specifications allow using wafers having a site flatness of up to 45 nm within the exposure area of a scanner when printing structures characterized by a DRAM ½ pitch of 45 nm. It is contemplated that conventional measures for accurately placing a substrate surface within the focus region of the projection objective may not be sufficient to account for those values of allowable unevenness of the substrate surfaces within the exposure area in future scanning systems.

In some projection exposure methods, an active manipulation of the imaging properties of the projection objective is performed during the scanning operation, i.e. during the time interval between the beginning of one single scan and the end of one single scan, in which the substrate is moved relative to the effective image field of the projection objective to successively print parts of the pattern of the mask onto the substrate. The active manipulation causes at least one aberration property of the projection objective to be varied dynamically in a targeted fashion according to a given time profile during the scan. The manipulation may be effected by activating at least one manipulation device operatively connected to an optical element of the projection objective to actively change the optical effect of that manipulated optical element and, as a result, also to actively change the imaging properties of the entire projection objective.

Embodiments may be characterized by the fact that a field curvature of the projection objective is dynamically varied according to a given time profile during the scanning operation. A very efficient way to adapt the imaging properties of the projection objective to a time-dependent variation of the substrate surface shape and/or substrate surface position within the exposure area is thereby possible. Alternatively, or in addition, a dynamic variation of field curvature of the projection objective during scanning may also be employed to adapt the imaging properties to a variation of the surface shape and/or surface position of the pattern on the object side of the projection objective. Effects of mask bending caused e.g. by the influence of gravity and/or by forces and moments applied to a mask in a mask holder may thereby be compensated at least partly.

In systems subject to gradual drift of optical properties with time an optical property, such as the focus position, may vary slowly (with a small time constant) in one direction such that the optical property varies little, and in only one direction, during a single scanning operation. In contrast, in embodiments with highly dynamic compensation at least one aberration of the projection objective is changed successively in two opposite directions between a beginning and an end of the scanning operation. In other words, the direction of change may change one or more times during a single scanning operation. In doing so, negative effects of dome-like or valley-like surface unevenness with typical size in the order of the size of an exposure area may be compensated for.

In general, it may be difficult to vary one imaging aberration in an isolated fashion without influencing other imaging aberrations. Therefore, other aberrations, specifically other field aberrations such as distortion, coma, the field profile of defocus, astigmatism and superpositions thereof may be varied synchronously as the field curvature is varied.

In some embodiments, the step of changing at least one imaging property of the projection objective includes changing in a spatially resolving manner the optical effect caused by at least one field element of the projection objective. The term "field element" as used here relates to an optical element which includes at least one optical surface arranged in a projection beam path optically close to a field surface of the projection objective. Actively changing the optical effect caused by a field element allows to exert relatively large corrective effects on field aberrations, such as a field curvature and distortion, while at the same time the influence of the change on wavefront aberrations, such as astigmatism, coma, spherical aberration and higher order aberrations may be kept small. Manipulating a field element may therefore be used to change in a targeted manner field aberrations substantially without inducing parasitic pupil aberrations at the same time.

There are various ways to characterize a position "optically close to a field surface". In general, it may be useful to define the axial position of optical surface, such as surfaces of lenses or mirrors, by the paraxial sub-aperture ratio SAR which is defined here as:

$$SAR = (\text{sign } CRH) * (MRH/(|MRH| + |CRH|)).$$

In this definition, parameter MRH denotes the paraxial marginal ray height and parameter CRH denotes the paraxial chief ray height of the imaging process. For the purpose of this application, the term "chief ray" (also known as principle ray) denotes a ray running from an outermost field point (farthest away from the optical axis) of an effectively used object field to the center of the entrance pupil. In rotational symmetric systems the chief ray may be chosen from an equivalent field point in the meridional plane. In projection objectives being essentially telecentric on the object side, the chief ray emanates from the object surface parallel or at a very small angle with respect to the optical axis. The imaging process is further characterized by the trajectory of marginal rays. A "marginal ray" as used herein is a ray running from an axial object field point (field point on the optical axis) to the edge of an aperture stop. That marginal ray may not contribute to image formation due to vignetting when an off-axis effective objective field is used. Both chief ray and marginal ray are used here in the paraxial approximation. The radial distances between such selected rays and the optical axis at a given axial position are denoted as "chief ray height" (CRH) and "marginal ray height" (MRH), respectively. A ray height ratio RHR=CRH/MRH may be used to characterize proximity to or distance from field surfaces or pupil surfaces.

A definition of the paraxial marginal ray and the paraxial chief ray may be found, for example, in: "Fundamental Optical Design" by Michael J. Kidger, SPIE PRESS, Bellingham, Wash., USA (Chapter 2), which document is incorporated herein by reference.

The paraxial sub-aperture ratio as defined here is a signed quantity providing a measure describing the relative proximity of a position along an optical path to a field plane or a pupil plane, respectively. In the definition given above, the paraxial sub-aperture ratio is normalized to values between −1 and 1, where the condition SAR=0 holds for a field plane and a point of discontinuity with a jump from SAR=−1 to SAR=+1 or from SAR=+1 to SAR=−1 corresponds to a pupil plane. Therefore, optical surfaces being positioned optically close to a field plane (such as the object surface or the image surface) are characterized by values of the paraxial sub-aperture ratio close to 0, whereas axial positions optically close to a pupil surface are characterized by absolute values for the paraxial sub-aperture ratio close to 1. The sign of the paraxial sub-aperture ratio indicates the position of the plane optically upstream or downstream of a plane. For example, the paraxial sub-aperture ratio a small distance upstream of a pupil surface and a small distance downstream of a pupil surface may have the same absolute value, but opposite signs due to the fact that the chief ray height changes its sign upon transiting a pupil surface.

Bearing these definitions in mind, a field element may be defined as an optical element having at least one optical surface arranged optically nearer to a field surface than to a pupil surface. Positions optically close to a field surface may be characterized by an absolute value of the ray height ratio RHR=CRH/MRH>1.

In other words, typical optical surfaces "optically close to a field surface" are in positions where the absolute value of the chief ray height CRH exceeds the absolute value of the marginal ray height MRH.

In another description the surface "optically close to a field surface" may be characterized by values of the paraxial sub-aperture ratio SAR close to zero. For example, the paraxial sub-aperture SAR may be in the range between 0 and about 0.4 or between 0 and 0.2 at an optical surface of a field element.

In some embodiments, a field element is arranged immediately adjacent to the next field surface such that there is no optical element arranged between the field element and the closest field surface.

The field element may be an optical element of the projection objective. It is also possible that a field element is arranged between the object surface of the projection objective and the object-side entry surface of the projection objective or between the image-side exit surface of the projection objective and the image surface.

The field element provided for aberration manipulation may be a transparent optical element in the projection beam path. In this case, the optical effect of the transparent optical element may be varied or changed in a spatially resolving manner (depending on the location within the optically used area) by changing a spatial distribution of refractive power in the optically used area. For this purpose the two-dimensional distribution of refractive index of a transparent material of the transparent optical element may be changed in a targeted manner. This can be caused, for example, by a targeted local heating of the transparent material. Potentially suitable constructions are disclosed, for example, in WO 2008/034636 A2, the disclosure of which is incorporated herein by reference. Alternatively, or in addition, the local distribution of refractive power may be changed by changing a spatial distribution of local surface curvature of an optical surface of the transparent optical element. This can be caused by targeted deformation of the optical element, for example. Examples of manipulators are shown e.g. in US 2003/0234918 A1. A combination of changing the refractive index and changing the local distribution of surface curvature may be used. Further, manipulation may be effected by relative displacement of aspheric surfaces having complementary shape, such as shown, e.g. in EP 0 851 304 B1. Electro-optical manipulators may also be utilized. The construction and operation of conventional manipulators may have to be modified to allow sufficient dynamics.

Although the transparent optical field element may be designed as a lens having a substantial refractive power in each of its configurations, the transparent optical field element may also be shaped as a plane parallel plate having substantially no overall optical power. Such plate-like field element may be arranged very close to a field surface in many types of projection objectives, for example close to the object surface or—in projection objectives forming at least one real intermediate image—close to an intermediate image, In some embodiments, at least one field element is a mirror having a reflective surface arranged in the projection beam path optically close to a field surface. Changing the optical properties of the mirror may include changing a surface profile of the reflective surface in an optically used area. A mirror manipulator may be operatively connected to the field mirror and may be configured in such a way allowing to vary the shape of the reflective surface of the field mirror in one or two dimensions.

The number of degrees of freedom for dynamically changing imaging properties of the projection objective may be increased by providing at least two field elements, which may be manipulated in a prescribed coordinated manner independently of each other. For example, the projection objective may include two reflective field elements (field mirrors), each optically close to the field surface.

Each of the field mirrors may be assigned a mirror manipulator configured to vary the shape of the reflective surface of the field mirror in a target fashion.

U.S. Pat. No. 7,385,756 by the applicant discloses catadioptric in-line projection objectives having two intermediate images and two concave mirrors, each arranged near an intermediate, i.e. relatively close to a field surface. Both concave mirrors may be employed as manipulators. The disclosure of this document is incorporated herein by reference.

At least one field element may be arranged close to the object surface. In some embodiments, a transparent field element forms a first element of the projection objective immediately following the object surface such that an entry surface of the field element forms the entry surface of the projection objective. A strong influence on field aberrations may thereby be obtained substantially without influencing pupil aberrations to a significant degree. In projection objectives creating at least one real intermediate image between object surface and intermediate image surface a field element may be arranged optically close to the intermediate image. In some embodiments, the projection objective has at least two or exactly two intermediate images. A field element may be arranged optically close to each of the intermediate image surfaces, which are field surfaces of the projection objective.

Regarding the dynamics of typical manipulations it may be considered that modern scanning systems may operate with scanning speeds between about 0.2 m/s and about 2 m/s, for example. The scanning speed may be in the order of 700 mm/s to 800 mm/s Typical scanning path lengths may be in the order of several 10 mm (e.g. 30 mm-40 mm) This allows for exposure times in the order of some 10 ms (milliseconds) per exposure area (die). Considering a typical value of about 50 ms scanning time per die the dynamics of manipulation may be in the order of 20 Hz or more in typical cases, such as 40 Hz or more, or 60 Hz or more, or 80 Hz or more, or 100 Hz or more, or 120 Hz or more.

Regarding the amplitude of manipulations it is considered that a local change in field curvature peak-to-valley in the order of ±45 nm may be sufficient in many high NA systems to achieve a reasonable degree of compensation. Such high NA systems may have maximum usable NA in the order of NA=0.8 or higher (e.g. NA≥0.9, NA≥1, NA≥1.2, NA≥1.35).

In relative terms, it is presently considered that a rate of change in the order of 10% of the depth of focus (DOF) within 10 ms (milliseconds) may be sufficient in many cases to achieve sufficient compensation. In some embodiments, the field curvature is changed with a rate of change between about 0.5% and about 50% of the depth of focus (DOF) of the projection objective within a 1 ms time interval In embodiments configured to effectively compensate for negative effects of substrate unevenness the method may further include: generating substrate surface data representing a surface profile of the substrate in the exposure area; generating manipulator control signals based on the substrate surface data; and driving at least one manipulation device of the projection objective in response to the manipulator control signals to dynamically adapt the imaging properties of the projection objective to reduce imaging aberrations caused by the surface profile in the exposure area.

The substrate surface data may be generated by measuring a topography of the substrate surface in a measuring area including the exposure area. Alternatively, the substrate surface data may be derived from data contained in a look-up-table representing a topography of the substrate surface in a measuring area including the exposure area. Data of the look-up-table may be gathered in advance experimentally or from ab initio calculations. For example, a correction of field curvature may be performed based on a preceding measurement of substrate surface topography, while compensation concepts may be based on data contained in a look-up table.

Imaging aberrations induced by the unevenness of a wafer surface, for example, may thereby be compensated for in a very efficient way. Measurement may be performed by a conventional method. Wafer unevenness may be introduced, for example, by a substrate transfer process, as described for example in: H. W. van Zeijl, J. Su, J. Slabbekoorn, F. G. C. Bijnen, "Lithographic Alignment Offset Compensation for Substrate Transfer Process", Proc. STW/SAFE, Veldhoven, The Netherlands, 2005, pp 121-126.

In embodiments configured to effectively compensate for negative effects of unevenness of the mask, e.g. caused by gravity induced reticle bending, the method may further include: generating mask surface data representing a surface profile of the mask in an mask area corresponding to the exposure area; generating manipulator control signals based on the mask surface data; and driving at least one manipulation device of the projection objective in response to the manipulator control signals to dynamically adapt the imaging properties of the projection objective to reduce imaging aberrations caused by the surface profile in the mask area.

The mask surface data may be generated by measuring a topography of the mask surface in a measuring area including the mask area corresponding to the exposure area. Alternatively, the mask surface data may be derived from data contained in a look-up-table representing a topography of the mask surface in a measuring area including the mask area corresponding to the exposure area. Data of the look-up-table may be gathered in advance, e.g. experimentally or from ab initio calculations.

Imaging aberrations induced by the unevenness of a mask surface, for example, may thereby be compensated for in a very efficient way.

The previous and other properties can be seen not only in the claims but also in the description and the drawings, wherein individual characteristics may be used either alone or in sub-combinations as an exemplary embodiment of the disclosure and in other areas and may individually represent advantageous and patentable embodiments.

BRIEF DESCRIPTION OF THE DRAWINGS

FIG. 7A-7B shows two axial sections of a first exemplary embodiment of a catadioptric projection objective including two concave mirrors optically close to intermediate images and associated with dynamic mirror manipulators;

FIG. 10A-10B shows sections of a second exemplary embodiment of a catadioptric projection objective including a transparent manipulator element immediately adjacent to the object surface;

DETAILED DESCRIPTION

In the following description, the term "optical axis" refers to a straight line or a sequence of a straight-line segments passing through the centers of curvature of optical elements. The optical axis can be folded by folding mirrors (deflecting mirrors) such that angles are included between subsequent straight-line segments of the optical axis. In the examples presented below, the object is a mask (reticle) bearing the pattern of a layer of an integrated circuit or some other pattern, for example, a grating pattern. The image of the object is projected onto a wafer serving as a substrate that is coated with a layer of photoresist, although other types of substrates, such as components of liquid-crystal displays or substrates for optical gratings, are also feasible.

Where tables are provided to disclose the specification of a design shown in a figure, the table or tables are designated by the same numbers as the respective figures. Corresponding features in the figures are designated with like or identical reference identifications to facilitate understanding. Where lenses are designated, an identification L3-2 denotes the second lens in the third objective part (when viewed in the radiation propagation direction).

Figure 1:
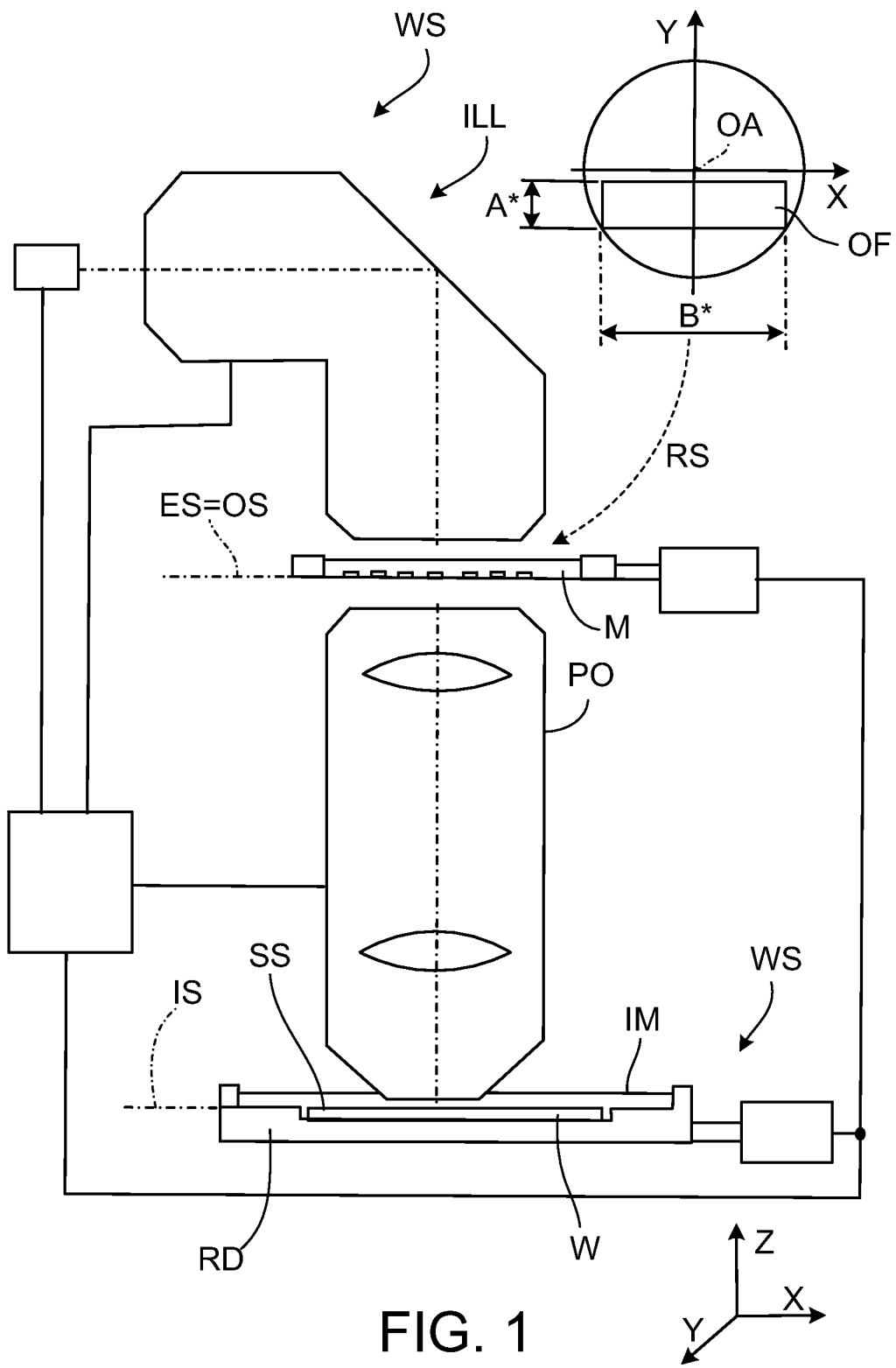
FIG. 1 shows a schematic drawing of an exemplary embodiment of a projection exposure apparatus for microlithography having an illumination system and a projection objective.

FIG. 1 shows schematically a microlithographic projection exposure system in the form of a wafer scanner WS, which is provided for fabricating large scale integrated semiconductor components via immersion lithography in a step-and-scan mode. The projection exposure system includes as primary radiation source S an Excimer laser having an operating wavelength of 193 nm. Other primary radiation sources are used in other exemplary embodiments, for example emitting at about 248 nm, 157 nm or 126 nm Radiation sources for the extreme ultraviolet (EUV) spectral range may also be utilized in connection with purely reflective (catoptric) optical systems. An illumination system ILL optically downstream of the light source generates, in its exit surface ES, a large, sharply delimited, homogeneously illuminated illumination field IF that is adapted to the desired telecentric properties of the downstream projection objective PO. The illumination system ILL has devices for selection of the illumination mode and, in the example, can be changed over between conventional on-axis illumination with a variable degree of coherence, and off-axis illumination, particularly annular illumination (having a ring shaped illuminated area in a pupil surface of the illumination system) and dipole or quadrupole illumination.

Arranged downstream of the illumination system is a device RS for holding and manipulating a mask M in such a way that a pattern formed on the mask lies in the exit surface ES of the illumination system, which coincides with the object surface OS of the projection objective PO. The device RS—usually referred to as "reticle stage"—for holding and manipulating the mask contains a mask holder and a scanner drive enabling the mask to be moved parallel to the object surface OS of the projection objective or perpendicular to the optical axis of projection objective and illumination system in a scanning direction (y-direction) during a scanning operation.

The reduction projection objective PO is designed to image an image of a pattern provided by the mask with a reduced scale of 4:1 onto a wafer W coated with a photoresist layer (magnification $|\beta|=0.25$). Other reduction scales, e.g. 5:1 or 8:1 are possible. The wafer W serving as a light-sensitive substrate is arranged in such a way that the macroscopically planar substrate surface SS with the photoresist layer essentially coincides with the planar image surface IS of the projection objective. The wafer is held by a device WST (wafer stage) including a scanner drive in order to move the wafer synchronously with the mask M in parallel with the latter. The wafer stage includes a z-manipulator mechanism to lift or lower the substrate parallel to the optical axis OA and a tilting manipulator mechanism to tilt the substrate about two axes perpendicular to the optical axis.

The device WST provided for holding the wafer W (wafer stage) is constructed for use in immersion lithography. It includes a receptacle device RD, which can be moved by a scanner drive and the bottom of which has a flat recess for receiving the wafer W. A peripheral edge forms a flat, upwardly open, liquid tight receptacle for a liquid immersion medium IM, which can be introduced into the receptacle and discharged from the latter by devices that are not shown. The height of the edge is dimensioned in such a way that the immersion medium that has been filled in can completely cover the surface SS of the wafer W and the exit-side end region of the projection objective PO can dip into the immersion liquid given a correctly set operating distance between objective exit and wafer surface.

The projection objective PO has a planoconvex lens as the last optical element nearest to the image surface IS. The planar exit surface of the planoconvex lens is the last optical surface of the projection objective PO. During operation of the projection exposure system, the exit surface of the last optical element is completely immersed in the immersion liquid IM and is wetted by the latter.

In other exemplary embodiments the exit surface is arranged at a working distance of a few millimeters above the substrate surface SS of the wafer in such a way that there is a gas-filled gap situated between the exit surface of the projection objective and the substrate surface (dry system).

As shown schematically in the inset figure of FIG. 1, the illumination system ILL is capable of generating an illumination field having a rectangular shape. The size and shape of the illumination field determines the size and shape of the effective object field OF of the projection objective actually used for projecting an image of a pattern on a mask in the image surface of the projection objective. The effective object field has a length A* parallel to the scanning direction and a width B*>A* in a cross-scan direction perpendicular to the scanning direction and does not include the optical axis (off-axis field).

The projection objective PO may include a plurality of schematically indicated lenses (typical numbers of lenses are often more than 10 or more than 15 lenses) and, if appropriate, other transparent optical components. The projection objective may be purely dioptric (lenses only). The projection objective may include at least one powered mirror, such as at least one concave mirror, in addition to lenses (catadioptric projection objective).

For many applications in the field of microlithography the image-side numerical aperture of the projection objective is NA>0.6, and in many exemplary embodiments NA is between approximately NA=0.65 and NA=0.95, which can be achieved by dry objectives. Using an immersion system allows obtaining NA values NA≥1, such as NA≥1.1 or NA≥1.2 or NA≥1.3 or NA≥1.4 or NA≥1.5 or NA≥1.6 NA≥1.7 or above. Typical resolutions down to about 150 nm, or 130 nm, or 100 nm, or 90 nm or less are also possible basically depending on the combination of image-side NA and the wavelength of the radiation source.

The projection objective PO is an optical imaging system designed to form an image of an object arranged in the object surface OS in the image surface, which is optically conjugate to the object surface. The imaging may be obtained without forming an intermediate image, or via one or more intermediate images, for example two intermediate images.

Figure 2A:
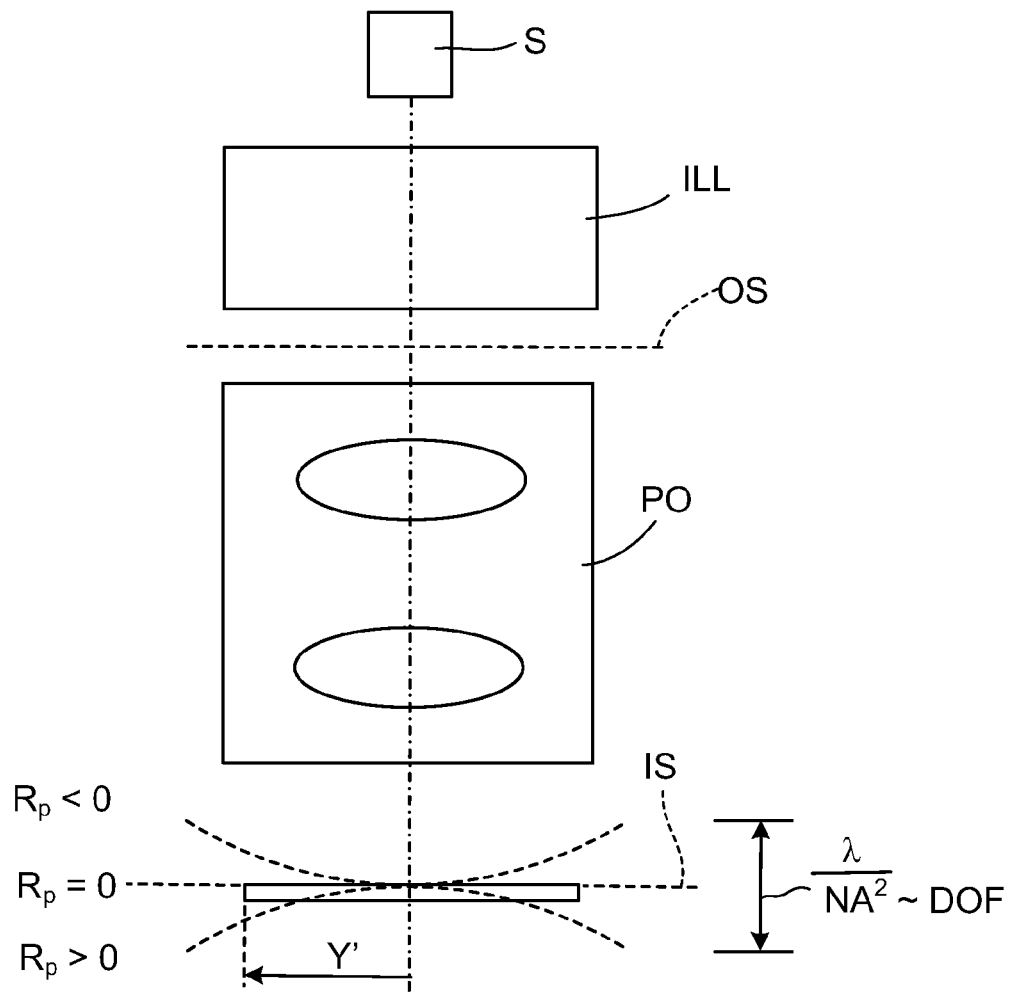
FIGS. 2A-2B shows a schematic illustrating the effect of different amounts of field curvature on the imaging process.

Every optical system has associated with it a sort of basic field curvature, which is conventionally called the Petzval curvature, which is now explained in more detail with reference to FIG. 2A. When there is no astigmatism, the sagittal and tangetial image surfaces coincide with each other and lay on the Petzval surface. Positive lenses (lenses with positive refractive power) introduce inward curvature of the Petzval surface to a system, and negative lenses (lenses with negative refractive power) introduce backward curvature. The Petzval curvature, $1/R_P$, is given by the Petzval sum $1/R_P$, which is the reciprocal of the Petzval radius $R_P$, which is the radius of curvature of the Petzval surface.

For example, he condition $R_P<0$ holds for a positive lens, corresponding to an inward curvature of the Petzval surface. Therefore, the image of a planar object will be concave towards the radiation direction, which condition is typically referred to as "undercorrection" of field curvature. In contrast, the condition $R_P>0$ holds for a concave mirror, corresponding to overcorrection of the field curvature. A flat image of a flat object is obtained by an imaging system with $R_P=0$. These conditions are shown schematically for projection objective PO in FIG. 2A.

The Petzval surface and the paraxial image surface coincide on the optical axis. The curvature of the Petzval surface may result in a situation where the Petzval surface departs from the ideal image surface for field points further away from the optical axis. The fact that the Petzval surface is curved transforms to a longitudinal departure p of the Petzval surface from the ideal image surface (which is usually flat) at a field point at the outer edge of the image field (at maximum image field height y'), measured parallel to the optical axis in the image space. The term "image field curvature" is conventionally used to refer to such longitudinal departure (or sag) at maximum image field height y', and may not be confused with the "curvature of the image field", which is the reciprocal of the radius of curvature of the image field.

Note that FIG. 2 is purely schematic and not to scale for any of the features discussed in connection with the figure.

Figure 2B:
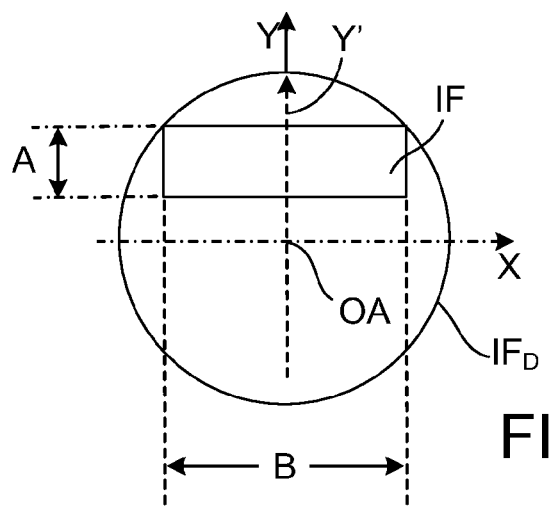

Conditions on the image-side of the objective are now explained in connection with FIG. 2B. For the purpose of this application the image field size may be characterized by a maximum image field height y', which corresponds to the radius of the (circular) "design image field" of the objective. The design image field $IF_D$ includes all field points of the image surface for which the imaging fidelity of the objective is sufficiently good for the intended lithographic process. With other words: all imaging aberrations are corrected sufficiently for the intended application within zones having radial coordinates equal to or smaller than the maximum image field height y', whereas one or more aberrations may be higher than a desired threshold value for field points outside the design image field $IF_D$.

In general, not all field points within the design image field $IF_D$ are used for a lithographic process. Instead, exposure is only performed using field points lying within an effective image field IF, which should be sufficiently large in size to allow reasonably sized substrates to be exposed in a lithographic process. The effective image field desirably fits into the design image field $IF_D$ in order to include only field points for which the objective is sufficiently corrected and for which no vignetting occurs. There are various ways to fit an effective image field into a design image field depending on the design of an objective.

In projection exposure systems designed for a scanning operation, a slit-shaped effective image field IF is used. FIG. 2B shows an example of a rectangular effective off-axis image field IF, which may be utilized in connection with exemplary embodiments of obscuration-free catadioptric projection objectives as discussed exemplarily below. In soother embodiments, an effective image field with an arcuate shape (sometimes noted as annular field or ring field) may be used. The size of an effective image field may generally be described in terms of a length A parallel to the scanning direction and a width B>A perpendicular to the scanning direction, thereby defining an aspect ratio AR=B/A>1. In many exemplary embodiments the aspect ratio may be in the range from 2:1 to 10:1, for example.

State-of-the-art scanning projection exposure systems may be equipped with a wafer stage allowing to move the substrate table parallel to the optical axis (z-manipulation) and also to tilt the wafer table about two mutually perpendicular axes perpendicular to the optical axis (x-tilt and y-tilt). The system may be operated to shift and/or tilt the wafer table between exposure steps in order to adjust the position of the substrate surface with respect to the focal region of the projection objective based on previous measurements of the substrate surface (see e.g. U.S. Pat. No. 6,674,510 B1).

However, those systems are not fully capable of accounting for local unevenness of the substrate surface within an exposure region. Instead, a compromise position of the substrate surface with respect to the focal region of the projection objective will typically be obtained. The inventors have recognized, however, that an uneven surface profile within an exposure area may cause deterioration of the quality of the imaging process, thereby leading to increased reject rates in the manufacturing of microstuctured semiconductor devices, for example.

Figure 3A:
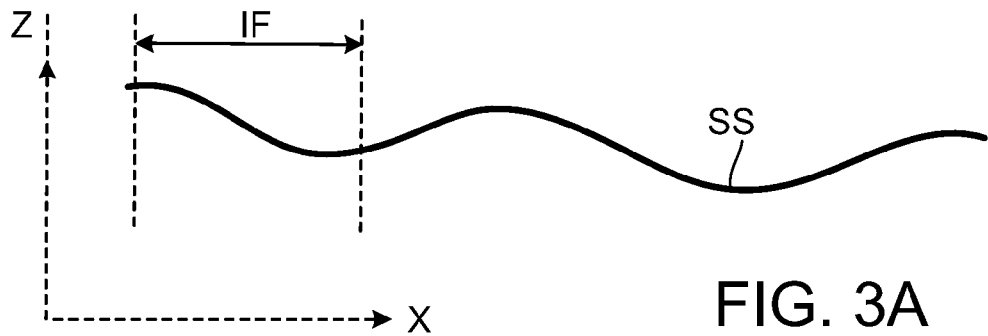
FIGS. 3A-3C shows schematically the conventional principle of correcting defocus errors using a wafer stage capable of lifting or lowering a substrate surface parallel to the optical axis.
Figure 3B:
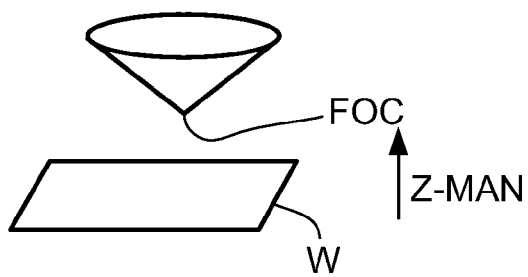
Figure 3C:
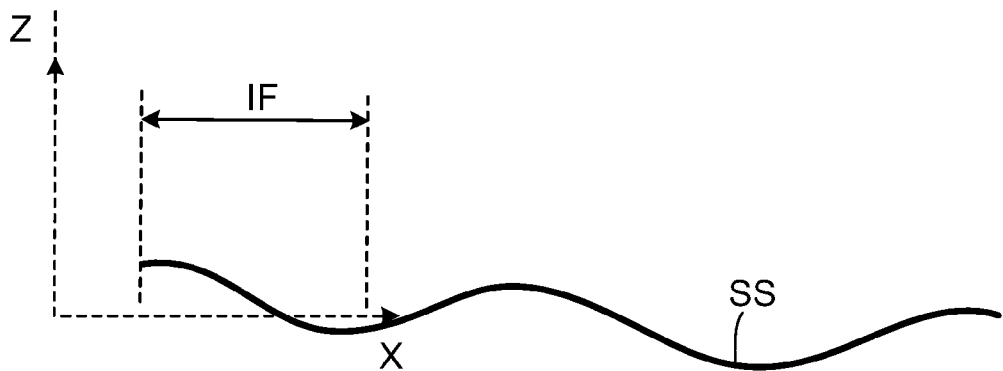

FIGS. 3A-3C show schematically the conventional principle of a correction using a wafer stage capable of lifting or lowering the substrate surface parallel to the optical axis (z manipulation). In FIG. 3A the uneven substrate surface SS lies entirely outside the focus position of the projection objective at z=0. Therefore, as seen in FIG. 3B, the location of the focus FOC lies above the substrate surface of the wafer W. If the wafer stage is lifted in axial direction by a predefined amount (z-MAN), the uneven substrate surface may be brought into the region of best focus such that at least parts of the exposure area are in focus, and defocus aberrations are reduced (3C). However, depending of the depth of focus it may occur that parts of the exposure area are still out of focus beyond an acceptable threshold value, whereby contrast may deteriorate significantly at least in parts of the exposure area.

Figures 4A, 4B, 4C:
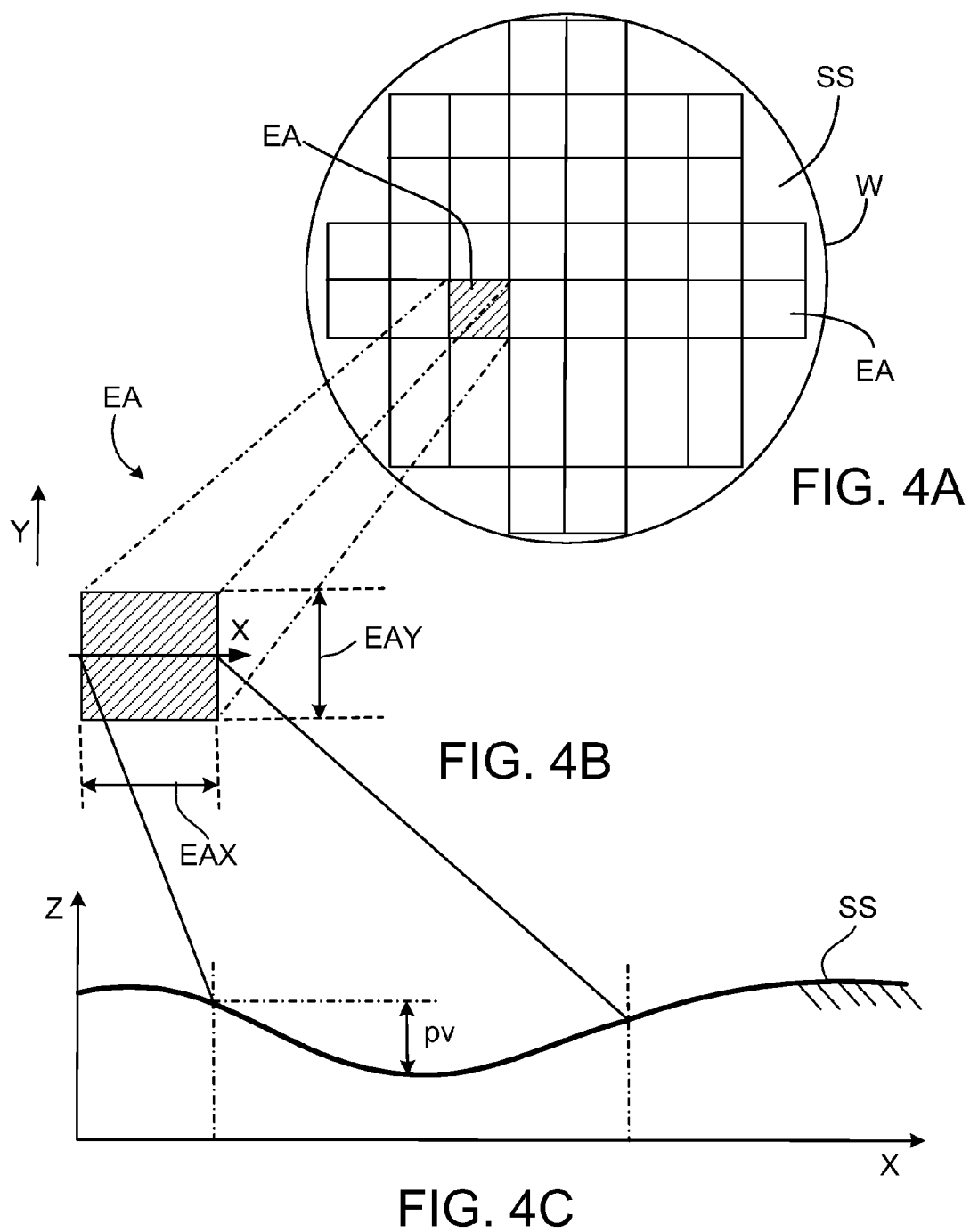
FIG. 4 shows in 4A an axial view of a semiconductor wafer with a plurality of exposure areas (dies), in 4B one selected rectangular exposure area, and in 4C a vertical section through the exposure area showing an uneven substrate surface.

In the following the unevenness of the substrate surface will be treated as a disturbance for the lithographic imaging process. For illustration purposes, FIG. 4A shows an axial view of a semiconductor wafer W having a substrate surface SS subdivided in two large number of rectangular exposure areas EA (or dies) arranged in a network of adjacent dies which are successively irradiated via the reticle, one at a time. Each exposure area has a width EAX, corresponding to the width of the effective image field of the projection objective in the cross-scan direction (x-direction) and a length EAY which may be equal, larger or smaller than the width EAX and which is substantially greater than the height A of the effective image field. FIG. 4B shows a vertical section (x-z section) through the substrate showing the multiply curved substrate surface SS. It is contemplated that after global adjustment of the axial position and the tilt angle of the entire substrate the local unevenness of the substrate surface results in a surface profile having an essentially parabolic (quadratic) field profile in x-direction at least in a first approximation. The amount of deviation from a planar reference surface may be quantified by the peak-to-valley value pv in the respective area, which is defined here as the difference between minimum and maximum profile height in the exposure area. It is further contemplated that the curvature of the substrate surface SS in the orthogonal y-direction (scanning direction) can be neglected due to the high aspect ratio of the slit-shaped effective image field (for example 4<AR<6). This uneven surface profile of the substrate will therefore induce at least in a first approximation, a quadratic field profile of the defocus and, at the same time, a quadratic field profile of a spherical aberration due to the high image-side numerical aperture of the projection objective. Note that these aberrations are independent of the optical design of the projection objective, and are only dependent from the image-side NA of the projection objective.

In the following, the wavefront aberrations caused by the projection system and/or induced by external conditions are expressed as a linear combination of polynomials. In the optics field, several types of polynomials are available for describing aberrations, for example Seidel polynomials or Zernike polynomials. Zernike polynomials are employed in the following to characterize aberrations.

The technique of employing Zernike terms to describe wavefront aberrations originating from optical surfaces deviating from being perfectly spherical is a state-of-the art technique. It is also well established that the different Zernike terms signify different aberration phenomena including defocus, astigmatism, coma and spherical aberration up to higher aberrations. An aberration may be expressed as a linear combination of a selected number of Zernike polynomials. Zernike polynomials are a set of complete orthogonal polynomials defined on a unit circle. Polar coordinates are used, for example with $\rho$ being the normalized radius and $\theta$ being the azimuth angle. A wavefront aberration $W(\rho, \theta)$ may be expanded in Zernike polynomials as a sum of products of Zernike terms and respective weighting factors (see e.g. Handbook of Optical Systems: Vol. 2, Physical Image Formation, ed. By H Gross, Wiley-VCH Verlag GmbH & Co. KGaA, Chapter 20.2, (2005)). In a Zernike representation, the Zernike polynomials Z1, Z2, Z3 etc. have certain meanings identifying respective contributions to an overall aberration. For example, $Z1=1$ corresponds to a constant term (or piston term), $Z2=\rho \cos \theta$ corresponds to a distortion in x direction (or a wavefront tilt in x direction), $Z3=\rho \sin \theta$ corresponds to distortion in y direction (or a wavefront tilt in y direction), $Z4=2\rho^2-1$ corresponds to a defocus (parabolic part), $Z5=\rho^2 \cos 2\theta$ 0 corresponds to astigmatism third order, etc.

Zernike polynomials may also be used to characterize deviations of an optical surface, such as a lens surface or a mirror surface, from a nominal surface, e.g. a spherical surface.

Figure 5:
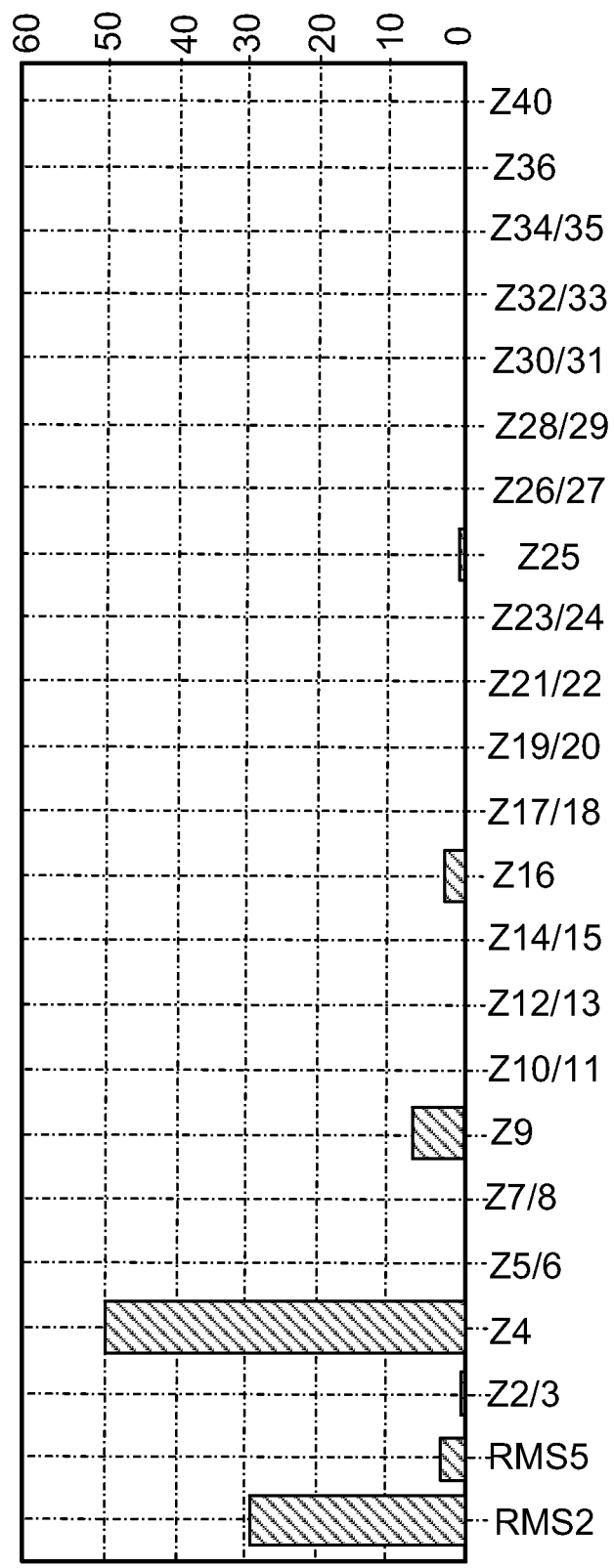
FIG. 5 shows a Zernike spectrum representing the effect of an essentially quadratic surface profile in x direction within an exposure area on selected aberrations.

FIG. 5 shows a Zernike spectrum representing the effect of an essentially quadratic surface profile in x-direction within an exposure area for a substrate surface unevenness characterized by a peak-to-valley-value PV=100 nm in the exposure area. It is evident that the unevenness basically influences the defocus (Zernike coefficient Z4) and the spherical aberration (primary spherical aberration Z9, secondary spherical aberration Z16 etc.), while at the same time the level of other aberrations induced by the uneven (non-planar) surface profile is comparatively small.

Figure 6A:
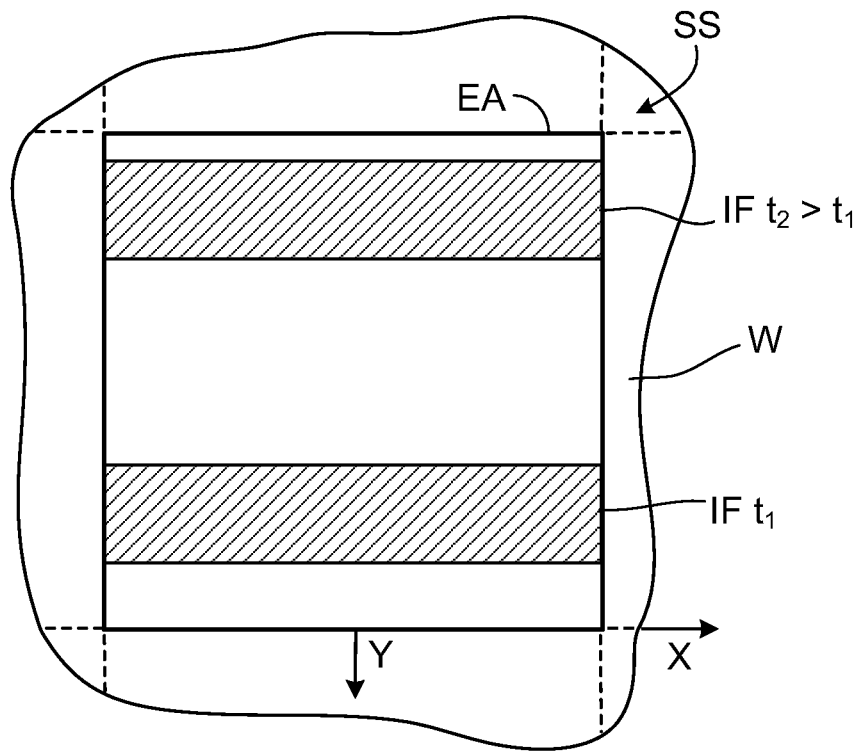
FIG. 6 shows in 6A the positions of a scanning field in an exposure area at two different instances of time and in 6B the respective curvature of the image field of a projection objective dynamically manipulated to conform to the surface shape of the exposure area within the respective image field position.

The following example shows how imaging aberrations induced by uneven substrate surface within an exposure area of the scanning lithography apparatus may be significantly reduced. Schematic FIG. 6A shows a rectangular exposure area EA on an uneven wafer surface during a scanning operation at two different instant of time. At the first instant of time $t_1$ the illuminated slit-shaped effective image field IF of the projection objective is positioned close to the lower edge of the exposure area. As the scanning proceeds the wafer moves relative to the stationary projection objective in scanning direction (y-direction) such that the illuminated effective image field is at different position spaced apart from the first position at a later instant of time, $t_2$. With typical values for scanning speeds (e.g. between about 0.2 m/s and 2 m/s) and exposure area sizes with typical edge length in the order of one or more centimeters, e.g. between 20 mm and 40 mm, the time interval $\Delta t$ involved to cover the entire exposure area with the illuminated image field in one scanning operation may typically range between about 10 ms and 200 ms, for example.

Figure 6B:
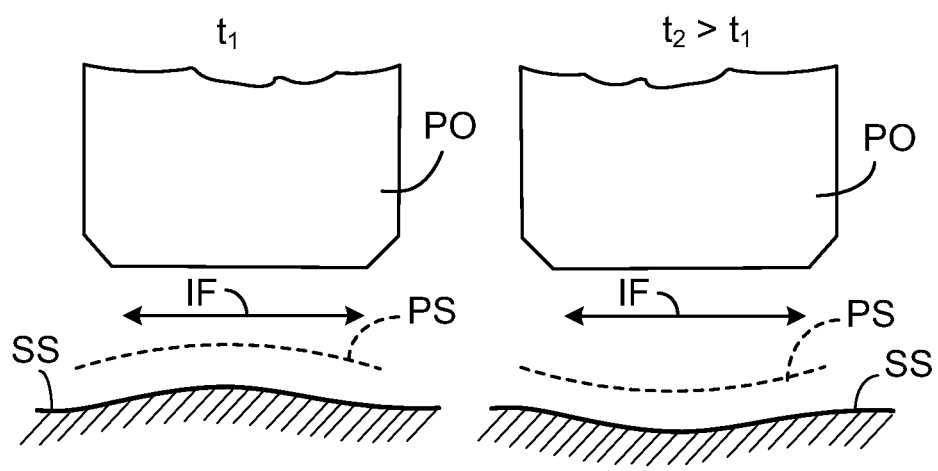

FIG. 6B shows respective sections of the substrate in the x-z-plane perpendicular to the scanning direction. In each case, the image-side end of the projection objective PO is shown, the exit-side of the projection objective spaced apart by working distance from the uneven substrate surface SS of the substrate. While the substrate surface has a convex surface shape at $t_1$, the substrate surface is concavely curved in a spaced apart region traversed by the projection beam at a later time $t_2 > t_1$.

The dashed line in each case represents the Petzval surface PS of the projection objective, which is adapted to conform to the surface topography of the substrate within the effective image field to allow reducing the imaging aberrations caused by the uneven substrate surface. In the example, the projection objective is slightly undercorrected with respect to field curvature at the moment $t_1$ and the correction status is dynamically changed to a slightly overcorrected condition at moment $t_2$. This significant variation of image field curvature of the imaging system is effective dynamically within fractions of a second adapted to the scanning speed. The variation is effective based on surface topography measurements performed prior to the scanning operation, as explained in more detail below.

Considering a typical value of about 50 ms scanning time per die the dynamics of manipulation may be in the order of 20 Hz or more, for example.

In relative terms, it is presently considered that a rate of change in the order of 10% of the depth of focus (DOF) within 10 ms (milliseconds) may be sufficient in many cases to achieve sufficient compensation. In some exemplary embodiments, the defocus is changed with a rate of change between about 0.5% and about 50% of the depth of focus (DOF) of the projection objective within a 1 ms time interval.

The rate of change of imaging aberrations, such as field curvature and/or distortion, brought about by active manipulation of one ore more optical elements of the projection objective may be orders of magnitude faster than time-dependent changes which may occur during the use of the projection system caused by environmental changes, such as changes of environmental pressure and/or temperature, and/or changes induced by heating of the system.

The effects of targeted manipulation of one or more optical elements of projection objectives situated relatively close to a respective field surface (field elements) will now be described in more detail using working examples of catadioptric projection objectives adapted to immersion lithography at an NA>1. The respective exposure systems may be equipped with state-of-the-art manipulators for moving the mask and/or the reticle parallel to the optical axis and for tilting the mask and/or the wafer about one or more tilt axis perpendicular to the optical axis. In addition, the exposure systems may be equipped with wavelength manipulators to shift the center wavelength λ of the system within a manipulation range Δλ adapted to the status of chromatic correction of the respective projection objectives.

In each case, one or more additional manipulators are specifically provided to account for effects of substrate surface unevenness and/or unevenness of the reticle, as explained more detailed below.

FIGS. 7A and 7B show two axial sections of a first exemplary embodiment of a catadioptric projection objective 700. Given a demagnifying imaging scale of 4:1 (β=−0.25) the projection objective is telecentric on the object side and on the image side has an image-side numerical aperture NA=1.35. The effective image field size is 26 mm by 5.5 mm. The specification is given in tables 7, 7A. FIG. 7A shows a section in the x-z-plane, while FIG. 7B shows the respective section in the y-z-plane perpendicular thereto. The specification data for the system are taken from the exemplary embodiment shown in FIG. 3 of US 2008/0174858 A1. The corresponding disclosure is incorporated herein by reference.

Projection objective 700 is designed to project an image of a pattern on a reticle arranged in the planar object surface OS (object plane) into the planar image surface IS (image plane) on a reduced scale, for example, 4:1, while creating exactly two real intermediate images IMI1, IMI2. The rectangular effective object field OF and image field IF are off-axis, i.e. entirely outside the optical axis OA. A first refractive objective part OP1 is designed for imaging the pattern provided in the object surface into the first intermediate image IMI1. A second, catoptric (purely reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

Projection objective 700 is an example of a "concatenated" projection objective having a plurality of cascaded objective parts which are each configured as imaging systems and are linked via intermediate images, the image (intermediate image) generated by a preceding imaging system in the radiation path serving as object for the succeeding imaging system in the radiation path. The succeeding imaging system can generate a further intermediate image (as in the case of the second objective part OP2) or forms the last imaging system of the projection objective, which generates the "final" image field in the image plane of the projection objective (like the third objective part OP3).

The path of the chief ray CR of an outer field point of the off-axis object field OF is indicated in FIG. 7B in order to facilitate following the beam path of the projection beam.

Three mutually conjugated pupil surfaces P1, P2 and P3 are formed at positions where the chief ray CR intersects the optical axis. A first pupil surface P1 is formed in the first objective part between object surface and first intermediate image, a second pupil surface P2 is formed in the second objective part between first and second intermediate image, and a third pupil surface P3 is formed in the third objective part between second intermediate image and the image surface IS.

The second objective part OP2 includes a first concave mirror CM1 having the concave mirror surface facing the object side, and a second concave mirror CM2 having the concave mirror surface facing the image side. The used parts of the mirror surfaces, i.e. those areas of the mirror surfaces which are illuminated during operation, are both continuous or unbroken, i.e. the mirrors do not have a hole or bore in the illuminated region. The mirror surfaces facing each other define a catadioptric cavity, which is also denoted intermirror space, enclosed by the curved surfaces defined by the concave mirrors. The intermediate images IMI1, IMI2 are both situated inside the catadioptric cavity well apart from the mirror surfaces.

The objective 700 is rotational symmetric and has one straight optical axis OA common to all refractive and reflective optical components ("In-line system"). There are no folding mirrors. An even number of reflections occurs. Object surface and image surface are parallel. The concave mirrors have small diameters allowing to arrange them close together and rather close to the intermediate images lying in between. The concave mirrors are both constructed and illuminated as off-axis sections of axial symmetric surfaces. The light beam passes by the edges of the concave mirrors facing the optical axis without vignetting. Both concave mirrors are positioned optically remote from a pupil surface rather close to the next intermediate image. The objective has an unobscured circular pupil centered around the optical axis thus allowing use as projection objectives for microlithography.

Both concave mirrors CM1, CM2 are arranged optically close to a field surface formed by the next intermediate image, as indicated by the following table A giving the data for marginal ray height MRH, chief ray height CRH, ray height ratio RHR and sub-aperture ratio SAR:

TABLE A

|  | MRH | CRH | RHR | SAR |
|---|---|---|---|---|
| CM1 | 18.33 | −147.93 | −8.1 | −0.11 |
| CM2 | 13.68 | 119.00 | +8.7 | +0.10 |

A position optically close to a field surface may also be characterized by the shape of the projection beam at the respective surface. Where an optical surface is optically close to a field surface, the cross sectional shape of the projection beam deviates significantly from the circular shape typically found in a pupil surface or in proximity thereto. In this context, the term "projection beam" describes the bundle of all rays running from the effective object field in the object surface towards the effective image field in the image surface. Surface positions optically close to a field surface may be defined as positions where the beam diameters of the projection beam in two mutually perpendicular directions orthogonal to the propagation direction of the beam may deviate by more than 50% or more than 100% or more from each other. Typically, an illuminated area on an optical surface optically close to a field surface will have a shape strongly deviating from a circle end resembling a high aspect ratio rectangle corresponding to a desirable field shape in scanning lithographic projection apparatus. It can be seen from FIG. 9 below that the illuminated areas on both the first and second concave mirror are essentially rectangular with rounded edges, the rectangle having about the aspect ratio AR of the effective object and image field. The rectangular shape of the effective object field OF may be seen from the comparison between FIGS. 7A and 7B, wherein in FIG. 7A the object field is cut along the long side (x-direction) whereas in FIG.

7B the object field is cut parallel to the scanning direction i.e. parallel to the short edge of the rectangular effective object field.

A primary function of the two concave mirrors CM1 and CM2 is to correct the Petzval sum by providing an overcorrecting contribution to Petzval sum counteracting the undercorrecting influence of positive refractive power of lenses. The contribution of the concave mirrors to field curvature may be varied dynamically by varying the surface curvature of the reflective surfaces according to a defined spatial and time profile. For this purpose, each of the first and second concave mirrors is associated with a mirror manipulator MM1, MM2, respectively, both configured for a two-dimensional deformation (deformation with spatial resolution in two dimensions) of the associated concave mirror during a scanning operation. The mirror manipulators may be identical or different in construction.

In the example, each of the concave mirrors has a highly reflective (HR) coating on a flexible portion of a mirror substrate. A number of actuators (represented by arrows) of a mirror manipulator MM1 or MM2 are operatively coupled to the back side of the flexible portion. The actuators are controlled by a mirror control unit MCU, which may be an integral part of central control unit of the projection exposure apparatus. The manipulator control unit is connected to receive signals representing a desired deformation of the mirror surface. The mirror manipulator and corresponding control unit may be designed essentially as disclosed in applicants patent applications US 2002/0048096 A1 or US 2005 0280910 A1 (corresponding to WO 03/98350 A2), for example. The corresponding disclosures are incorporated into this application by reference.

Any suitable construction of the pupil mirror manipulator may be used instead, for example manipulators using electromechanical actuators, such as piezoelectrical elements, actuators responding to fluid pressure changes, electric and/or magnetic actuators. These actuators may be used to deform a continuous (unbroken) mirror surface as described. The mirror manipulator may also include one or more heating elements and/or cooling elements effecting local temperature changes of the mirror leading to a desired deformation of the mirror surface. Resistance heaters or Peltier elements may be used for that purpose.

The effect of two-dimensional deformation of both the first and the second concave mirror CM1, CM2 during a scanning operation was simulated for a wafer substrate having an uneven substrate surface with a concave parabolic profile in cross-scan direction (x-direction) with 45 nm difference between maximum height and minimum height (45 nm peak-to-valley), substantially as schematically shown in FIG. 4B. Three correction scenarios SC1, SC2 and SC3 have been simulated.

In a first scenario SC1 the substrate unevenness has been corrected by active manipulation of the wafer z-position and wafer tilt status, basically as explained in connection with FIG. 3, in a conventional manner. In a second scenario SC2 a number of active manipulations on optical elements including relative displacements of lenses parallel to the optical axis and tilting of lenses have been performed in addition.

Figure 8:
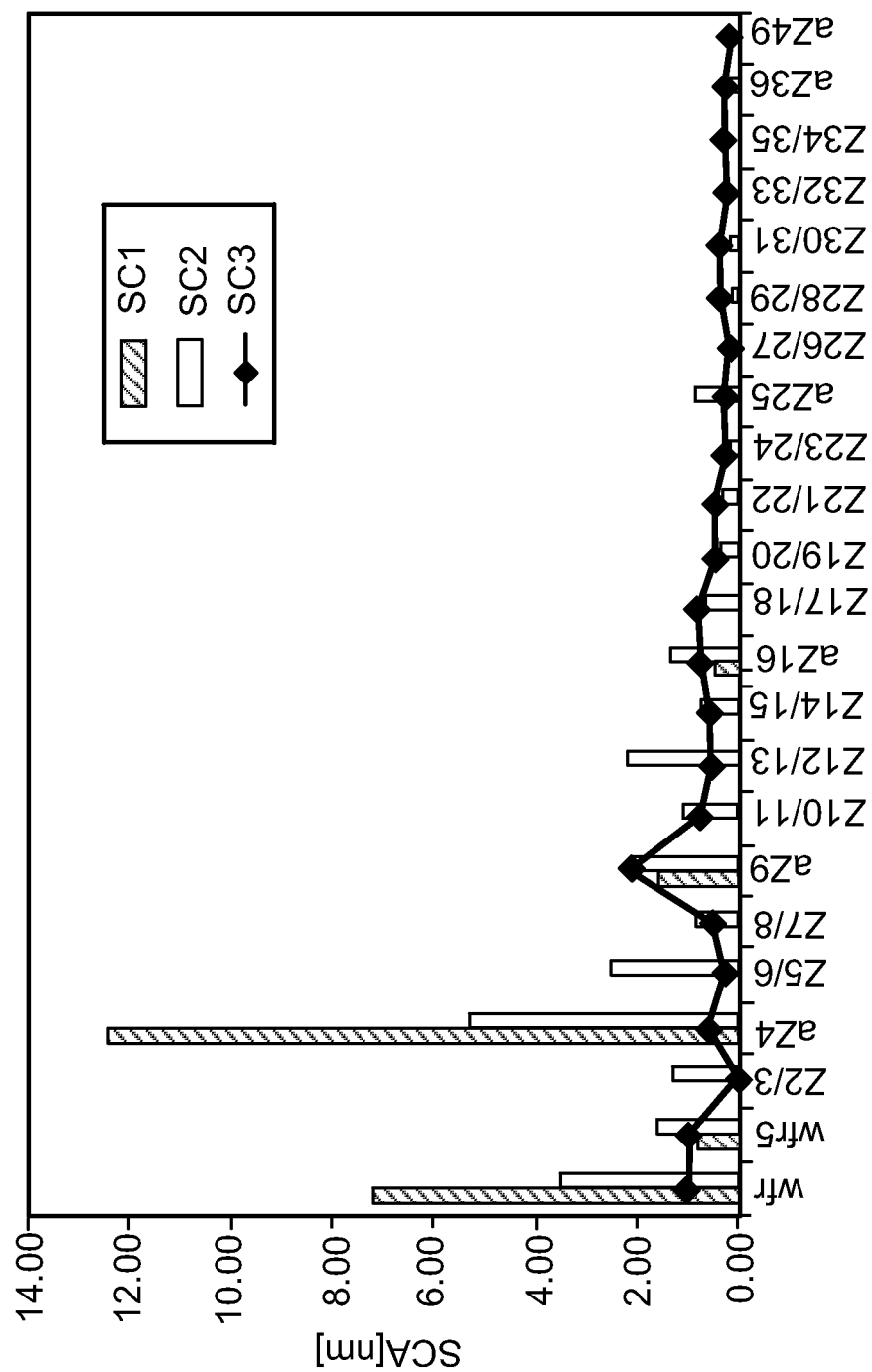
FIG. 8 shows a diagram indicating aberrations induced by an uneven substrate surface and decomposed into contributions described by Zernicke coefficients for three different compensation scenarios.

In a third scenario SC3 the surface shapes of both the first and the second concave mirror CM1, CM2 have been two-dimensionally deformed in a time-dependent manner during the scanning operation to reduce aberrations caused by the unevenness of the substrate surface. FIG. 8 shows a comparative diagram of aberrations induced by the quadratic unevenness (PV=45 nm) in the mentioned three scenarios SC1, SC2, SC3. The overall induced aberrations are decomposed in contributions described by Zernike coefficients, which are shown as the values on the abscissa of FIG. 8. The ordinate shows the scanned aberrations SCA in nm. A significant improvement of the scanned aberrations is immediately discernible for the case where two mirrors, each optically close to a field surface (intermediate images), are dynamically deformed during the scanning operation to reduce aberrations. Both the defocus aberration (Z4) and the wavefront tilt aberration (Z2/3) could be reduced significantly both with respect to the standard scenario SC2 and even more reduced with respect to the first scenario SC1, where only an optimization of wafer position with respect to axial position and tilt is used. Both defocus (Z4) and wavefront tilt (Z2/3) can be reduced by about 90% relative to the standard scenario SC2, while even better improvement by about 95% is obtained relative to the pure wafer scenario SC1. For example, defocus aberration Z4 could be reduced from about 12 nm to about 0.6 nm by dynamic deformation of the two concave mirrors. Likewise, a significant improvement is obtained for astigmatism (Z5/6), which could be reduced by about 90% relative to the standard scenario SC2.

These values indicate that the dynamic deformation of field elements reduces significantly the contribution of substrate surface unevenness to the focus budget, where it is presently amongst the dominating contributions. A significant improvement of process latitude in the lithographic process is thereby obtained. At the same time, the desired properties related to focus errors can be relaxed with regard to other contributing effects, such as lens heating or the like.

Figure 9:
FIG. 9 shows schematically surface deformations of the two concave mirrors shown in FIG. 7 which compensate partly aberrations induced by an uneven substrate surface topography.

FIG. 9 shows schematically the correction deformations applied to the first concave mirror CM1 (FIG. 9A) and second concave mirror CM2 (FIG. 9B) involved to obtain the improvement. In each case, the peak-to-valley (PV) deformations of the reflective surfaces are relatively small and may range in a region below 200 nm, for example. In this specific case, the PV deformation is about 80 nm for CM1 and about 160 nm for CM2. Further, the figures exemplarily show that relatively long-wave deformations are effective to reduce the aberrations caused by the long-wave quadratic deformation of the substrate surface in the cross-scan direction. This indicates that the deviation of the concave base profile of the mirrors need not be very complex in many cases such that the construction of respective mirror manipulators may be relatively simple. In general, a multi-Zernike-mirror manipulator may be used in each case, allowing targeted deformations of the reflective surface which may be decomposed in Zernike coefficients up to high values, such as between Z2 and Z49, for example. Instead, deformations with less complex structure may be sufficient in many cases, allowing use of less complex mirror manipulators.

The compensation mechanism can be implemented in a projection exposure apparatus including a projection objective which has one or more manipulators associated with one or more optical elements of the projection objective by integrating the manipulator(s) into a control system configured to change imaging properties of the projection objective actively during the scanning operation according to a given profile to change dynamically at least aberration of the projection objective between a beginning and an end of the scanning operation. The manipulator associates with an optical element may be connected to a control unit generating manipulator control signals which initiate respective changes of the optical effect of the manipulated optical element. The manipulator control signals may be generated in different ways. In some exemplary embodiments, a measuring system is provided which allows measuring the surface topography of a substrate surface in a measuring area including the exposure area. Alternatively, the substrate surface data may also be derived from data contained in a look-up-table representing a measured or calculated topography of the substrate surface in an area including the exposure area.

Where the system is configured to allow compensation of distortion of other aberrations caused by non-ideal surface shape of the mask, corresponding measures can be implemented to account for non-even surface shape of the reticle. Corresponding mask surface data representing a surface profile of the mask in a mask area corresponding to the exposure area may be generated either based on a measurement or based on data from a look-up-table, for example. Mask surface data may be processed by the control unit to generate manipulator control signals which are then used to control at least one manipulation device within the projection objective to dynamically adapt the imaging properties of the projection objective in a compensating way to reduce imaging aberrations caused by the surface profile in the mask area.

FIGS. 10A and 10B show a second exemplary embodiment of a catadioptric projection objective 1000 for immersion lithography at about X=193 nm according to a different design. Given a demagnifying imaging scale of 4:1 (13=−0.25) the projection objective is telecentric on the object side and on the image side has an image-side numerical aperture NA=1.32. The effective image field size is 26 mm by 5.5 mm. The specification is given in tables 10, 10A. FIG. 10A shows a section in the x-z-plane, while FIG. 10B shows the respective section in the y-z-plane perpendicular thereto. The specification data for the system are taken from the exemplary embodiment shown in FIG. 7 of US 2008/0174858 A1. The corresponding disclosure is incorporated herein by reference.

Projection objective 1000 is designed to project an image of a pattern on a reticle arranged in the planar object surface OS (object plane) into the planar image surface IS (image plane) on a reduced scale, for example, 4:1, while creating exactly two real intermediate images IMI1, IMI2. The rectangular effective object field OF and image field IF are off-axis, i.e. entirely outside the optical axis OA. A first refractive objective part OP1 is designed for imaging the pattern provided in the object surface into the first intermediate image IMI1. A second, catadioptric (refractive/reflective) objective part OP2 images the first intermediate image IMI1 into the second intermediate image IMI2 at a magnification close to 1:(−1). A third, refractive objective part OP3 images the second intermediate image IMI2 onto the image surface IS with a strong reduction ratio.

Projection objective 1000 is another example of a "concatenated" projection objective having a plurality of cascaded objective parts which are each configured as imaging systems and are linked via intermediate images, the image (intermediate image) generated by a preceding imaging system in the radiation path serving as object for the succeeding imaging system in the radiation path. The sequence is refractive-catadioptric-refractive (R-C-R).

The path of the chief ray CR of an outer field point of the off-axis object field OF is drawn bold in FIG. 10B in order to facilitate following the beam path of the projection beam.

Three mutually conjugated pupil surfaces P1, P2 and P3 are formed at positions where the chief ray CR intersects the optical axis. A first pupil surface P1 is formed in the first objective part between object surface and first intermediate image, a secand pupil surface P2 is formed in the second objective part between first and second intermediate image, and a third pupil surface P3 is formed in the third objective part between second intermediate image and the image surface IS.

The second objective part OP2 includes a single concave mirror CM situated at the second pupil surface P2. A first planar folding mirror FM1 is arranged optically close to the first intermediate image IMI1 at an angle of 45° to the optical axis OA such that it reflects the radiation coming from the object surface in the direction of the concave mirror CM. A second folding mirror FM2, having a planar mirror surface aligned at right angles to the planar mirror surface of the first folding mirror, reflects the radiation coming from the concave mirror CM in the direction of the image surface, which is parallel to the object surface. The folding mirrors FM1, FM2 are each located in the optical vicinity of, but at a small distance from the closest intermediate image. Therefore, the folding mirrors are field mirrors. A double pass region where the radiation passes twice in opposite directions is thereby formed geometrically between the deflecting mirrors FM1, FM2 and the concave mirror CM. A negative group NG having two negative lenses is arranged in a region with large marginal ray height near the concave mirror and coaxial with the concave mirror such that the radiation passes twice in opposite directions through the negative group. No optical element is arranged between the negative group and the concave mirror.

The first optical element immediately adjacent to the object surface OS is a transparent plane-parallel plate PP arranged very close to the object field. Following Table B gives the data for marginal ray height MRH, chief ray height CRH, ray height ratio RHR and sub-aperture ratio SAR of the entry surface 1 and the exit surface 2 of the plate PP:

TABLE B

| | MRH | CRH | RHR | SAR |
|---|---|---|---|---|
| 1 | −39.77 | −60.64 | +1.5 | +0.4 |
| 2 | −41.50 | −60.64 | +1.5 | +0.4 |

The plate is associated with the manipulation device MAN allowing to vary the two-dimensional distribution of refractive index of the plate material in response to electrical signals on a short time scale with high spatial resolution. The construction of the manipulator may be based on the wire grid manipulator system disclosed in WO 2008/034636 A2, which is incorporated herein by reference. A cooling system for actively cooling the transparent manipulator element may be provided to increase the dynamics and allow for rapid changes of temperature.

Further, manipulation may be effected by relative displacement of aspheric surfaces having complementary shape, such as shown, e.g. in EP 0 851 304 B1. A pair of aspheres may be arranged immediately adjacent to the object surface as a field element. Electro-optical manipulators may also be utilized. Further, a manipulator may be constructed to include cylinder lens elements rotatable relative to each other (see e.g. EP 0 660 169 B1), and placed near a field surface, such as the object surface.

As in the first exemplary embodiment, three correction scenarios SC1, SC2 and SC3 have been simulated for comparison. In the first scenario SC1 the substrate unevenness has been corrected by active manipulation of the wafer z-position and wafer tilt status, basically as explained in connection with FIG. 3, in a conventional manner. In a second scenario SC2 a number of active manipulations on optical elements as explained above have been performed in addition.

In a third scenario SC3 time-dependent lateral refractive index inhomogeneities within the plane plate PP have been applied to optimize the field curvature and other field aberrations of the projection objective dynamically during the scanning operation. The two-dimensional (spatial) distribution of refractive index may be described Zernike coefficients Z2 to Z49, for example.

Figure 11:
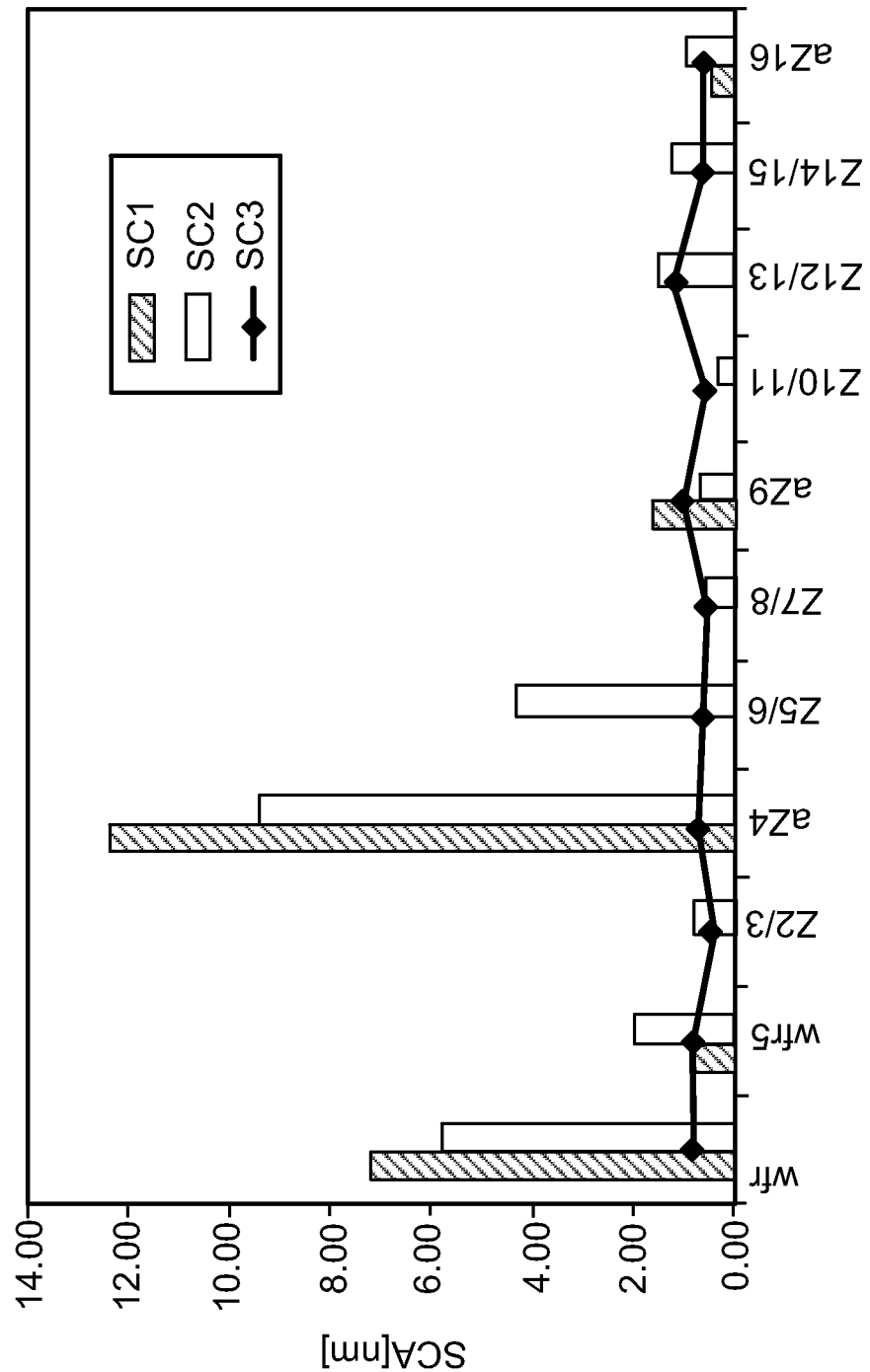
FIG. 11 shows a diagram indicating aberrations induced by an uneven substrate surface and decomposed into contributions described by Zernicke coefficients for three different compensation scenarios.

FIG. 11 shows a comparative diagram of aberrations induced by the quadratic unevenness (PV=45 nm) in the mentioned three scenarios SC1, SC2, SC3. The overall induced aberrations are decomposed in contributions described by Zernike coefficients, which are shown as the values on the abscissa of FIG. 11. The ordinate shows the scanned aberrations in nm. A significant improvement of the scanned aberrations is immediately discernible for the case where the plate-like optical element PP is dynamically activated during the scanning operation to reduce aberrations. Both the defocus aberration (Z4) and the wavefront tilt aberration (Z2/3) could be reduced significantly both with respect to the standard scenario SC2 and even more reduced with respect to the first scenario SC1, where only an optimization of wafer position with respect to axial position and tilt is used. Both defocus (Z4) and wavefront tilt (Z2/3) can be reduced by about 90% relative to the standard scenario SC2, while even better improvement by about 93% is obtained relative to the pure wafer scenario SC1. For example, defocus aberration Z4 could be reduced from about 12 nm to about 0.8 nm by dynamic modification of reractive index distribution in the plate PP. Likewise, a significant improvement is obtained for astigmatism (Z5/6), which could be reduced by about 90% relative to the standard scenario SC2. The parasitic astigmatism aberration Z2/3 is reduced from 0.7 nm (in scenario SC2) to 0.3 nm in scenario SC3.

These values indicate that the dynamic modifications of refractive power distribution in the field plate PP reduces significantly the contribution of substrate surface unevenness to the focus budget, where it is presently amongst the dominating contributions. A significant improvement of process latitude in the lithographic process is thereby obtained. At the same time, the desired properties related to focus errors can be relaxed with regard to other contributing effects, such as lens heating or the like.

The exemplary embodiments show that a dynamic change of imaging properties, such as field curvature of the projection objective during a scanning operation may significantly improve the aberration level for the entire exposure process in cases where the surface of the substrate to be exposed is not perfectly flat in the exposure area. However, this is only one of many problems which may be solved or induced by providing a projection exposure system with a manipulation mechanism allowing a targeted change of the imaging properties of the projection objective during a single scanning operation. Another problem which may be addressed by the improved structure and functionality is the problem commonly referred to as "reticle bending".

In general, the projection objective is aligned with its optical axis in the direction of gravity in typical exposure systems. The mask bearing the pattern is then typically oriented in a horizontal plane, perpendicular to the optical axis. As a consequence the reticle (mask) may sag owing to the force of gravity, the sagging basically being a function of the type of the reticle and of the mounting technique securing the reticle in a reticle holder. In general, the two-dimensional deviation from a planar alignment of the pattern may not be known a priori and may be difficult to determine. As a consequence of the sagging, individual locations on the reticle which are to be imaged may be displaced from their desired position (given at a perfectly planar reticle) in a way that cannot be completely predicted a priori, the direction and length of this displacement generally being a function of the location on the reticle.

A further cause for possible sagging of the reticle is the direct influence of the mounting technique on the shape of the mounted reticle. In general, forces and moments caused by bearings and/or clamps acting on the reticle may contribute to a complex deformation status of the reticle during the exposure. These influences may not be fully known a priori and can differ from reticle to reticle, but they can also be identical for classes of reticles.

Problems resulting from reticle bending have been frequently addressed in various ways, such as demonstrated for example in WO 2006/01300 A2 by the applicant or in US 2003/0133087 A1.

The problems of aberrations caused by reticle bending may be addressed in a dynamic fashion with exemplary embodiments of the exposure apparatus configured to dynamically change the imaging properties of the projection objective during a scanning operation.

Figure 12:
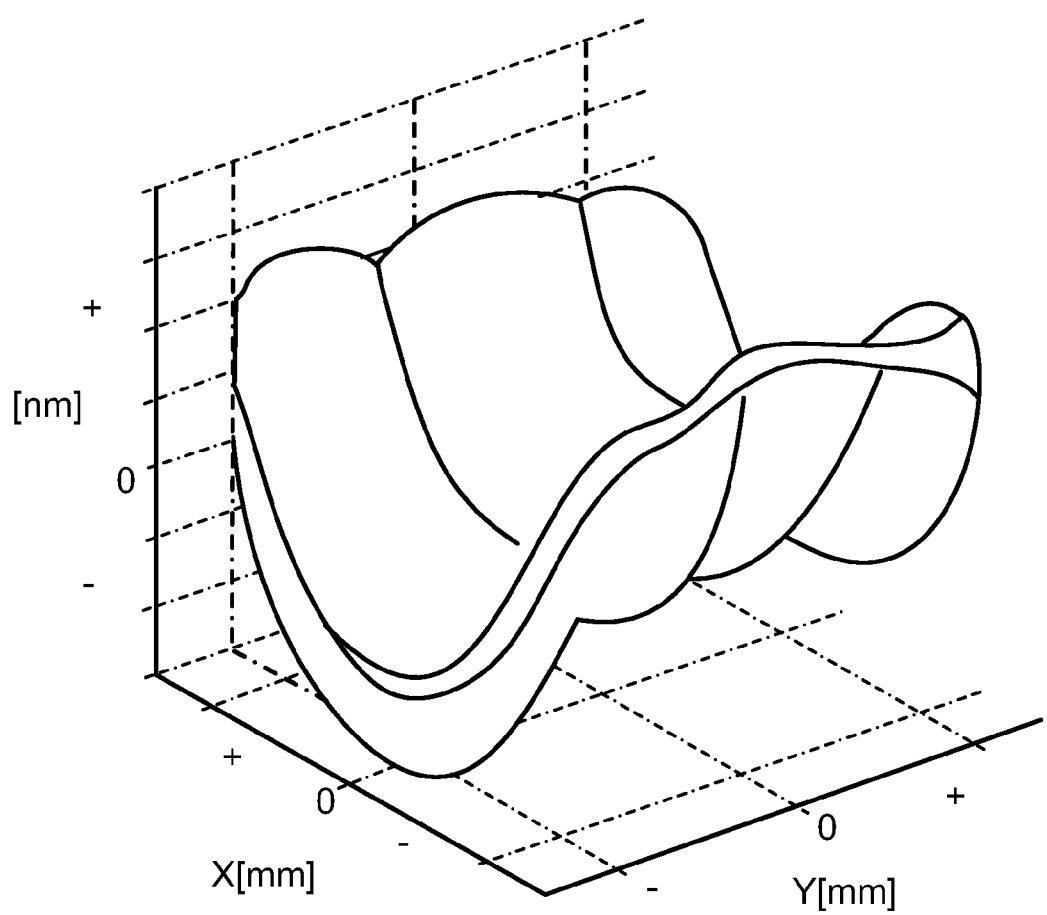
FIG. 12 shows a schematic three-dimensional diagram showing a saddle-shaped deformation of a reticle.

FIG. 12 shows qualitatively deformations of a multiply bend reticle surface in a perspective view. If the reticle is held by a support on a frame, the deformation may assume a substantially parabolic shape, as shown, for example, in WO 2006/013100 A2. If the reticle is mounted by a clamping technique engaging at three or more points in a peripheral region of the reticle, a saddle-shaped deformation may result, which is superimposed on the gravity-induced deformation. Such saddle-shaped deformation is shown in FIG. 12 for a reticle that is clamped at four corner positions. The reticle bending may result in a displacement of the center region of the reticle relative to the edge region in the order of one or more tenth of a micrometer. It may be possible to account for a systematic reticle bending effect by counteractive measures during adjustment of a projection objective such that the projection objective has a defined non-zero field curvature which globally accounts for a certain amount of reticle bending. However, non-systematic contributions caused by using different reticles and/or caused by hardly predictable temperature induced deformations during the operation may not be fully accounted for in advance by corresponding adjustment of the projection objective. Those non-predictable effects may contribute significantly to the focus budget and it may not be possible to fully account for the corresponding aberration effects by standard manipulations. However, active manipulation of at least one field element in a dynamic fashion during a scanning operation may significantly improve the aberration level towards smaller values.

Figure 13:
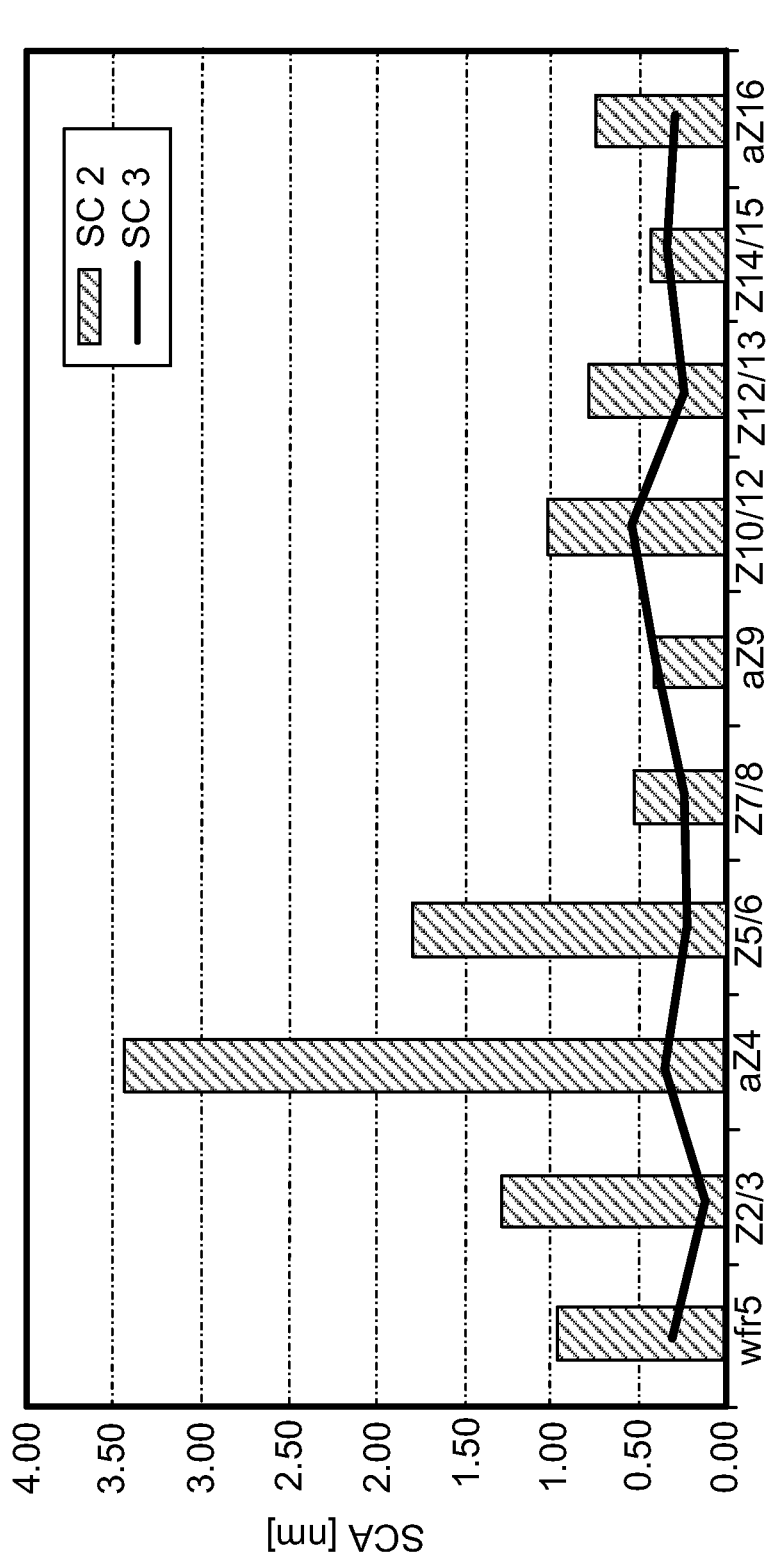
FIG. 13 shows diagram indicating aberrations induced by an uneven reticle surface and decomposed into contributions described by Zernike coefficients for two different compensation scenarios in an exemplary embodiment having two deformable field mirrors.

FIG. 13 shows a comparative view of two correction scenarios. The figure shows the residual aberrations after adjustment of the manipulators. The columns show the residual errors (scanned aberrations) in a standard scenario SC2 for an anamophotic (saddle-shaped) deformation of the reticle with 400 nm PV-deformation at the reticle center. In comparison, the solid line SC3 shows respective values in a correction scenario including targeted deformations of the two concave mirrors CM1, CM2 (field mirrors) of the exemplary embodiment of FIG. 7. The defocus value Z4 amounts to about 7 nm in a system without correction. The defocus error can be reduced to about 3.5 nm in the standard scenario SC2. Additional targeted deformation of the concave reflective surfaces of mirrors CM1, CM2 can further reduce the defocus by about an order of magnitude to about 0.3 nm. At the same time, the parasitic errors induced by this correction are generally small, such as below 0.5 nm as shown.

Figure 14:
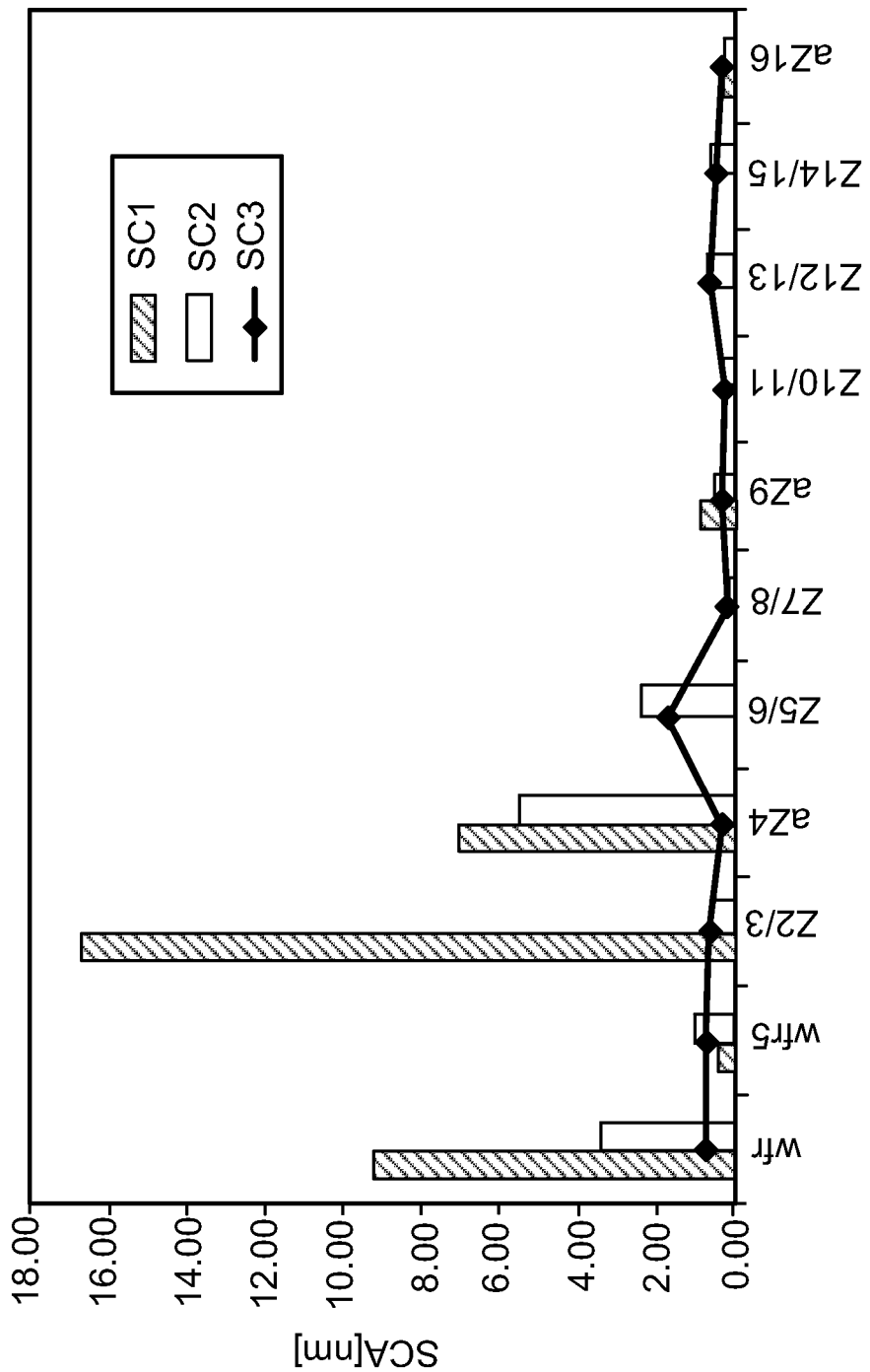
FIG. 14 shows and comparative view of three correction scenarios for an anamorphotic reticle bending in an exemplary embodiment having a transparent manipulator element close to the object surface.

A similar study has been performed for the second exemplary embodiment employing a transparent field PP element coupled with a manipulator allowing for a change in the two-dimensional distribution of refractive index within the plate. FIG. 14 shows a comparative view of three correction scenarios. Employing the standard correction allows to reduce residual errors of the focus (Z4) from about 7 nm to about 6 nm Employing the two-dimensional manipulator acting on a field element close to the object surface allows for significantly reducing those errors. Specifically, the defocus aberration may be reduced from about 6 nm to about 0.4 nm without introducing parasitic field aberrations above a critical level. In addition, the tilt error Z2/3 could be reduced from about 16.8 nm in scenario SC1 (Wafer manipulations only) to about 0.6 nm with the 2D-manipulator arranged close to the object surface.

Figure 15:
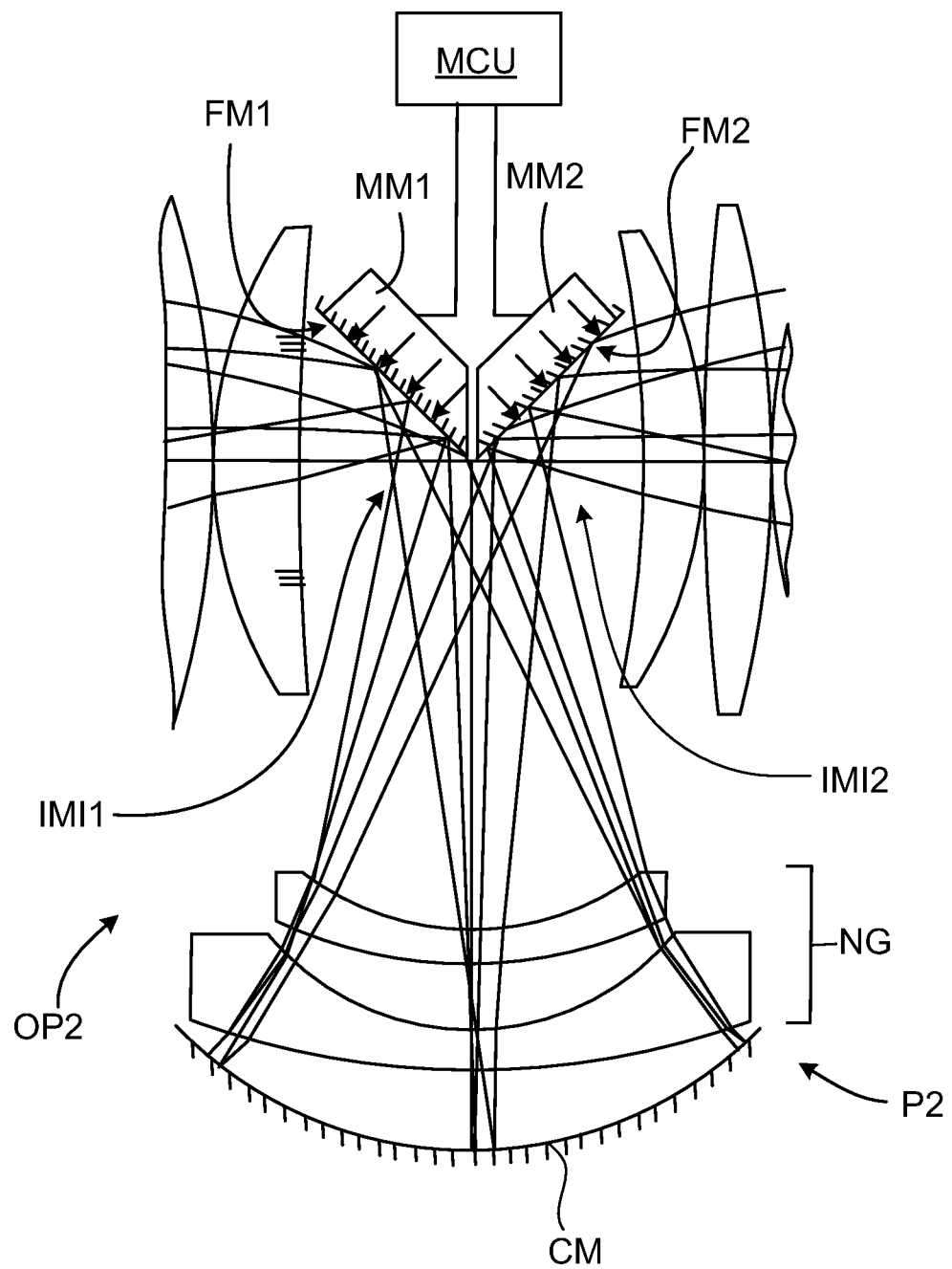
FIG. 15 shows a detail of an exemplary embodiment including two folding mirrors which can be deformed independently from each other by mirror manipulators.

FIG. 15 shows an example of another option to manipulate the optical properties of a projection objective during scanning by bending one or more reflective surfaces of mirrors arranged optically close to a field surface. FIG. 15 shows a detail of a meridional section through a projection objective where all optical elements have the same specification as described in connection with FIG. 10A, 10B. Therefore, the specification of the optical system shown partly in FIG. 15 is the same as given in Tables 10, 10A. As described above, the second objective part OP2 includes a concave mirror CM situated close to the second pupil surface P2 of the projection objective, which is situated optically between the first intermediate image IMI1 (generated by the refractive first objective part) and the second intermediate image IMI2, which is finally imaged by the third, refractive objective part to form the image in the image surface. The first folding mirror FM1 is arranged optically close to the first intermediate image and reflects radiation provided by the first objective part OP1 towards the concave mirror CM. The second folding mirror FM2, arranged at 90° relative to the first folding mirror FM1, is arranged optically close to the second intermediate image IMI2 and reflects radiation coming from the concave mirror CM towards the image surface. The reflective surfaces of both the first and the second folding mirror are substantially flat (planar) in their nominal state of operation wherein they have no optical power and their only function is to deflect radiation incident thereon. Table C below gives the data for the marginal ray height MRH, chief ray height CRH, ray height ratio RHR and sub-aperture ratio SAR of the first folding mirror FM1 and the second folding mirror FM2, respectively. It is easily seen particularly from the sub-aperture ratio that both folding mirrors are situated very close to a field surface (SAR close to zero).

TABLE C

|  | MRH | CRH | RHR | SAR |
|---|---|---|---|---|
| FM1 | +2.37 | +131.27 | +55.4 | +0.018 |
| FM2 | −7.67 | −112.09 | +14.6 | +0.064 |

In this exemplary embodiment, the portions of the substrates of the folding mirrors carrying the reflective mirror coating are flexible to a limited extent such that the reflective surface area can be bend in response to external forces to a certain extent. A number of actuators (represented by arrows) of a first mirror manipulator MM1 associated with the first folding mirror FM1 and a second mirror manipulator MM2 associated with the second folding mirror FM2 are operatively coupled to the backside of the flexible portion of the respective mirrors. The actuators are controlled by a mirror control unit MCU, which may be an integral part of a central control unit of the projection exposure apparatus. The mirror control unit is connected to receive signals representing a desired deformation, or an absence of deformation, of the respective mirror surfaces. Each mirror manipulator is configured to bend the associated reflective surface either in one dimension only (for example cylindrical shape of the mirror surface) or in two dimensions (for example substantially concave or convex spherical or aspherical mirror surface shape).

The bending manipulation of one or both folding mirrors ina an inward and/or an outward direction allows a variety of degrees of freedom to manipulate the optical performance of the projection objective particularly with respect to field aberrations. The mirror surfaces can be deformed in a time-dependent manner during a scanning operation to reduce undesired aberrations, such as aberrations caused by an unevenness of the substrate surface. Since there are two manipulators which may be operated independent of each other, different aberrations may be corrected independently from each other. Further, an additional manipulation range may be obtained in cases where manipulation of a single mirror would not be sufficient to provide the range of manipulation involved to compensate certain aberrations. The effects obtainable by manipulating the folding mirrors may be similar to those obtainable by manipulating concave mirrors arranged close to intermediate images such as described in connection with FIG. 7A, 7B. Therefore, reference is made to that description. One or more folding mirrors having an actively deformable reflective surface may be provided in addition to other manipulators, such as the transparent manipulator MAN formed by the plane plate PP in FIG. 10B to provide further degrees of freedom. Other exemplary embodiments do not have a plane plates which can be manipulated in the described manner.

It has been shown with various exemplary embodiments that a real-time correction of field aberrations, such as field curvature, during a scanning operation in a scanning projection exposure apparatus may significantly reduce imaging aberrations which may be induced by deviations of the substrate surface and/or of the surface of the pattern from the ideal planar shape. Specifically, negative effects of wafer surface unevenness and/or reticle bending in scanning exposure systems may be significantly reduced.

The above description of exemplary embodiments has been given by way of example. From the disclosure given, those skilled in the art will not only understand the present disclosure and its attendant advantages, but will also find apparent various changes and modifications to the structures and methods disclosed. It is sought, therefore, to cover all changes and modifications as fall within the spirit and scope of the disclosure, as defined by the appended claims, and equivalents thereof

TABLE 7

| SURFACE | RADIUS | THICKNESS | MATERAL | INDEX 193.37 nm | 1/2 FREEE DIAMETER |
|---|---|---|---|---|---|
| OBJECT | 0.000000 | 30.000000 |  | 1.000000 | 63.50 |
| 1 | 155.500468 | 47.980384 | SIO2 | 1.560188 | 82.82 |
| 2 | −333.324258 | 1.000851 |  | 1.000000 | 82.26 |
| 3 | 240.650949 | 10.194017 | SIO2 | 1.560188 | 79.90 |
| 4 | 106.801800 | 20.365766 |  | 1.000000 | 74.67 |

TABLE 7-continued

| SURFACE | RADIUS | THICKNESS | MATERIAL | INDEX 193.37 nm | 1/2 FREEE DIAMETER | |
|---|---|---|---|---|---|---|
| 5 | 124.630972 | 34.680113 | SIO2 | 1.560188 | 79.59 | |
| 6 | 468.398192 | 11.981603 | | 1.000000 | 77.78 | |
| 7 | 380.553803 | 26.909838 | SIO2 | 1.560188 | 77.24 | |
| 8 | −171.820449 | 19.336973 | | 1.000000 | 77.05 | |
| 9 | −3157.552773 | 18.733166 | SIO2 | 1.560188 | 63.69 | |
| 10 | −201.010840 | 2.828885 | | 1.000000 | 61.54 | |
| 11 | 0.000000 | 10.000000 | SIO2 | 1.560188 | 54.63 | |
| 12 | 0.000000 | 14.057031 | | 1.000000 | 51.30 | |
| 13 | −675.142412 | 17.151908 | SIO2 | 1.560188 | 45.97 | |
| 14 | −177.431040 | 17.484199 | | 1.000000 | 49.62 | |
| 15 | 0.000000 | 10.000000 | SIO2 | 1.560188 | 57.65 | |
| 16 | 0.000000 | 48.376949 | | 1.000000 | 59.68 | |
| 17 | −339.503853 | 22.085648 | SIO2 | 1.560188 | 72.90 | |
| 18 | −153.734447 | 9.426343 | | 1.000000 | 75.79 | |
| 19 | −133.551892 | 10.000178 | SIO2 | 1.560188 | 76.55 | |
| 20 | −159.012061 | 260.928174 | | 1.000000 | 80.56 | |
| 21 | −186.269426 | −223.122910 | | −1.000000 | 159.97 | REFL |
| 22 | 171.856468 | 290.241437 | | 1.000000 | 137.56 | REFL |
| 23 | 418.208640 | 33.119326 | SIO2 | 1.560188 | 109.84 | |
| 24 | −764.923828 | 24.991712 | | 1.000000 | 109.22 | |
| 25 | −933.573206 | 23.101710 | SIO2 | 1.560188 | 104.46 | |
| 26 | 1486.991752 | 3.727360 | | 1.000000 | 103.09 | |
| 27 | 264.108066 | 15.536565 | SIO2 | 1.560188 | 94.14 | |
| 28 | 124.187755 | 40.232391 | | 1.000000 | 84.09 | |
| 29 | −905.198558 | 11.197639 | SIO2 | 1.560188 | 83.89 | |
| 30 | 131.424652 | 22.232119 | | 1.000000 | 82.63 | |
| 31 | 288.907138 | 18.371287 | SIO2 | 1.560188 | 85.15 | |
| 32 | 1443.815086 | 26.039370 | | 1.000000 | 87.98 | |
| 33 | −219.723661 | 10.212957 | SIO2 | 1.560188 | 90.08 | |
| 34 | −505.370348 | 1.495833 | | 1.000000 | 104.53 | |
| 35 | 602.513212 | 45.614756 | SIO2 | 1.560188 | 113.36 | |
| 36 | −381.370078 | 0.999817 | | 1.000000 | 124.37 | |
| 37 | −3646.793540 | 62.876806 | SIO2 | 1.560188 | 133.45 | |
| 38 | −186.442382 | 0.999658 | | 1.000000 | 138.79 | |
| 39 | 803.321916 | 47.355581 | SIO2 | 1.560188 | 156.65 | |
| 40 | −403.820101 | 0.999375 | | 1.000000 | 158.05 | |
| 41 | 464.394742 | 43.310049 | SIO2 | 1.560188 | 156.92 | |
| 42 | −28298.847889 | 5.923544 | | 1.000000 | 155.75 | |
| Aper.St. | 0.000000 | −4.924437 | | 1.000000 | 153.99 | |
| 44 | 452.887984 | 57.784133 | SIO2 | 1.560188 | 151.45 | |
| 45 | −566.954376 | 1.000000 | | 1.000000 | 149.33 | |
| 46 | 114.038890 | 60.833075 | SIO2 | 1.560188 | 99.52 | |
| 47 | 1045.400093 | 1.000000 | | 1.000000 | 90.06 | |
| 48 | 61.105427 | 43.354396 | SIO2 | 1.560188 | 51.24 | |
| 49 | 0.000000 | 3.100000 | H2O | 1.436182 | 24.42 | |
| IMAGE | 0.000000 | 0.000000 | H2O | 1.436182 | 15.88 | |

NA = 1.35,
β = −0.25,
λ = 193 nm,
image field size 26 mm * 5.5 mm.

TABLE 7A

Aspherical Constants

| SRF | 2 | 7 | 10 | 21 |
|---|---|---|---|---|
| K | 0.000000 | 0.000000 | 0.000000 | −2.179800 |
| C1 | 6.25615673E−08 | −3.91970883E−07 | −1.05740650E−07 | −3.48837141E−08 |
| C2 | 3.98291586E−12 | 2.09559113E−11 | 4.58061705E−11 | 2.87484829E−13 |
| C3 | −9.45171648E−16 | 9.82281688E−16 | −9.11506463E−15 | −9.16227915E−18 |
| C4 | 1.33506075E−19 | −1.66737901E−20 | 3.32932453E−18 | 1.68127084E−22 |
| C5 | −1.30131298E−23 | −4.32368642E−23 | −7.84340820E−22 | −3.70862206E−27 |
| C6 | 8.34436130E−28 | 5.15009335E−27 | 1.06485056E−25 | 4.91461297E−32 |
| C7 | −2.58453411E−32 | −2.09824486E−31 | −6.44096726E−30 | −4.06294509E−37 |
| C8 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 |

| SRF | 22 | 26 | 29 | 31 |
|---|---|---|---|---|
| K | −0.680600 | 0.000000 | 0.000000 | 0.000000 |
| C1 | 7.08665406E−09 | −2.25360263E−07 | 2.93338485E−08 | 4.63356893E−09 |
| C2 | 1.05796279E−13 | 1.35102880E−11 | 3.99085713E−13 | −4.99736404E−12 |
| C3 | 1.49167226E−18 | 3.79578877E−17 | −6.05050026E−17 | 4.88963742E−16 |

TABLE 7A-continued

| Aspherical Constants | | | | |
|---|---|---|---|---|
| C4 | 1.62571301E−23 | −7.42121392E−20 | 1.25522927E−19 | −1.48446943E−19 |
| C5 | 4.83415117E−28 | 6.11793938E−24 | −1.87742919E−23 | 1.97755334E−23 |
| C6 | −3.21154060E−33 | −2.34729324E−28 | 1.07269082E−27 | −1.91898457E−27 |
| C7 | 1.42531822E−37 | 3.43409149E−33 | −3.21830574E−32 | 8.50123020E−32 |
| C8 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 |
| SRF | 34 | 35 | 37 | 39 |
| K | 0.000000 | 0.000000 | 0.000000 | 0.000000 |
| C1 | 1.03668480E−07 | −4.70359496E−08 | −1.94534158E−10 | −5.11706590E−08 |
| C2 | 2.75801089E−12 | 4.15939963E−12 | −3.07266701E−12 | 1.60140405E−12 |
| C3 | −3.27807145E−16 | −3.90892000E−16 | 1.39267169E−16 | 1.10341691E−17 |
| C4 | −2.15301048E−20 | 1.64438627E−20 | −1.59434604E−21 | −7.04763579E−22 |
| C5 | 1.08976725E−24 | −1.80866983E−25 | −5.98715796E−26 | −3.28833297E−26 |
| C6 | 6.73532870E−29 | −1.85786454E−29 | 2.24005496E−30 | 1.48518840E−30 |
| C7 | −2.25221802E−33 | 6.59409175E−34 | 0.00000000E+00 | −1.52353104E−35 |
| C8 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 |
| SRF | 42 | 45 | 47 | |
| K | 0.000000 | 0.000000 | 0.000000 | |
| C1 | −5.79976918E−08 | 2.42988807E−08 | 3.85557367E−08 | |
| C2 | 2.83727775E−12 | −1.85555835E−12 | 7.25233559E−12 | |
| C3 | −1.20786196E−17 | −2.74974282E−17 | −1.15590543E−15 | |
| C4 | −3.22879626E−21 | 6.44628653E−21 | 1.27817902E−19 | |
| C5 | 1.90525889E−25 | −2.71099457E−25 | −1.08124491E−23 | |
| C6 | −5.24966838E−30 | 5.29432933E−30 | 5.72390431E−28 | |
| C7 | 5.62271368E−35 | −4.24451451E−35 | −1.24244050E−32 | |
| C8 | 0.00000000E+00 | 0.00000000E+00 | 0.00000000E+00 | |
| C9 | 0.00000000E+00 | 0.00000000E+00 | 0.00000000E+00 | |

TABLE 10

| SURFACE | RADIUS | THICKNESS | MATERIAL | INDEX 193.31 nm | 1/2 FREE DIAMETER | |
|---|---|---|---|---|---|---|
| OBJECT | 0.000000 | 63.754200 | | 1.000000 | 60.64 | |
| 1 | 0.000000 | 8.000000 | SILUV | 1.560482 | 80.57 | |
| 2 | 0.000000 | 56.000000 | | 1.000000 | 82.16 | |
| 3 | 930.923922 | 52.000000 | SILUV | 1.560482 | 102.42 | |
| 4 | −256.201417 | 1.000000 | | 1.000000 | 106.20 | |
| 5 | 164.802556 | 35.773100 | SILUV | 1.560482 | 106.58 | |
| 6 | 341.545138 | 15.747900 | | 1.000000 | 103.06 | |
| 7 | 147.535157 | 56.488000 | SILUV | 1.560482 | 94.36 | |
| 8 | −647.942934 | 4.145000 | | 1.000000 | 87.10 | |
| 9 | −536.071478 | 18.297900 | SILUV | 1.560482 | 84.98 | |
| 10 | 180.585020 | 1.000000 | | 1.000000 | 69.07 | |
| 11 | 82.247096 | 28.431900 | SILUV | 1.560482 | 62.83 | |
| 12 | 121.636868 | 21.482876 | | 1.000000 | 55.13 | |
| 13 | 0.000000 | 10.000000 | SILUV | 1.560482 | 49.65 | |
| 14 | 0.000000 | 35.037652 | | 1.000000 | 45.92 | |
| 15 | −89.601791 | 44.878000 | SILUV | 1.560482 | 49.19 | |
| 16 | −203.308357 | 49.953200 | | 1.000000 | 70.60 | |
| 17 | −333.934057 | 37.672400 | SILUV | 1.560482 | 95.51 | |
| 18 | −153.471299 | 1.000000 | | 1.000000 | 101.95 | |
| 19 | −588.427923 | 47.008300 | SILUV | 1.560482 | 109.74 | |
| 20 | −177.569099 | 1.000000 | | 1.000000 | 113.61 | |
| 21 | 1289.635452 | 32.747800 | SILUV | 1.560482 | 110.26 | |
| 22 | −409.790925 | 1.000000 | | 1.000000 | 109.27 | |
| 23 | 196.979548 | 36.289500 | SILUV | 1.560482 | 97.10 | |
| 24 | 2948.592605 | 72.000000 | | 1.000000 | 91.85 | |
| 25 | 0.000000 | −204.306500 | | −1.000000 | 88.41 | REFL |
| 26 | 120.965260 | −15.000000 | SILUV | −1.560482 | 67.60 | |
| 27 | 177.749728 | −28.181900 | | −1.000000 | 76.71 | |
| 28 | 106.065668 | −18.000000 | SILUV | −1.560482 | 81.66 | |
| 29 | 323.567743 | −34.983200 | | −1.000000 | 112.46 | |
| 30 | 165.900097 | 34.983200 | | 1.000000 | 118.94 | REFL |
| 31 | 323.567743 | 18.000000 | SILUV | 1.560482 | 114.42 | |
| 32 | 106.065668 | 28.181900 | | 1.000000 | 87.43 | |
| 33 | 177.749728 | 15.000000 | SILUV | 1.560482 | 86.09 | |
| 34 | 120.965260 | 204.306500 | | 1.000000 | 77.89 | |
| 35 | 0.000000 | −72.000000 | | −1.000000 | 96.41 | REFL |
| 36 | 462.513697 | 24.493400 | SILUV | −1.560482 | 90.96 | |

TABLE 10-continued

| SURFACE | RADIUS | THICKNESS | MATERIAL | INDEX 193.31 nm | 1/2 FREE DIAMETER |
|---|---|---|---|---|---|
| 37 | 196.771640 | −1.000000 | | −1.000000 | 94.59 |
| 38 | −996.046057 | −27.579900 | SILUV | −1.560482 | 104.05 |
| 39 | 480.084349 | −1.000000 | | −1.000000 | 105.63 |
| 40 | −260.478322 | −35.771400 | SILUV | −1.560482 | 109.79 |
| 41 | −3444.700345 | −1.000000 | | −1.000000 | 108.53 |
| 42 | −189.044457 | −50.000000 | SILUV | −1.560482 | 104.52 |
| 43 | −630.985131 | −43.198700 | | −1.000000 | 96.24 |
| 44 | 675.856906 | −10.000000 | SILUV | −1.560482 | 85.17 |
| 45 | −117.005373 | −46.536000 | | −1.000000 | 77.36 |
| 46 | 214.318111 | −10.000000 | SILUV | −1.560482 | 78.01 |
| 47 | −191.854301 | −23.664400 | | −1.000000 | 90.88 |
| 48 | 1573.576031 | −31.506600 | SILUV | −1.560482 | 92.88 |
| 49 | 214.330939 | −1.000000 | | −1.000000 | 99.07 |
| 50 | −322.859172 | −33.185600 | SILUV | −1.560482 | 131.18 |
| 51 | −1112.917245 | −10.017200 | | −1.000000 | 133.09 |
| 52 | −2810.857827 | −22.000000 | SILUV | −1.560482 | 134.79 |
| 53 | −920.532878 | −42.079900 | | −1.000000 | 143.55 |
| 54 | 707.503574 | −62.025500 | SILUV | −1.560482 | 144.85 |
| 55 | 238.350224 | −1.000000 | | −1.000000 | 155.97 |
| 56 | −17926.557240 | −62.132800 | SILUV | −1.560482 | 176.77 |
| 57 | 336.363925 | −2.000000 | | −1.000000 | 178.83 |
| 58 | 0.000000 | −10.000000 | SILUV | −1.560482 | 178.34 |
| 59 | 0.000000 | −51.180119 | | −1.000000 | 178.29 |
| 60 | 0.000000 | 48.529765 | | −1.000000 | 178.13 |
| 61 | −303.574400 | −68.224400 | SILUV | −1.560482 | 178.47 |
| 62 | −19950.680601 | −7.986643 | | −1.000000 | 176.32 |
| 63 | −182.034245 | −77.612200 | SILUV | −1.560482 | 149.97 |
| 64 | −459.526735 | −1.000000 | | −1.000000 | 140.24 |
| 65 | −130.446554 | −49.999900 | SILUV | −1.560482 | 104.87 |
| 66 | −393.038792 | −1.000000 | | −1.000000 | 90.82 |
| 67 | −76.745086 | −43.335100 | SILUV | −1.560482 | 62.08 |
| 68 | 0.000000 | −1.000000 | H2OV | −1.435876 | 43.69 |
| 69 | 0.000000 | 13.000000 | SILUV | −1.560482 | 41.39 |
| 70 | 0.000000 | −3.000396 | H2OV | −1.435876 | 21.49 |
| IMAGE | 0.000000 | 0.000000 | H2OV | −1.435876 | 15.16 |

NA = 1.35,
β = −0.25,
λ = 193 nm,
image field size 26 mm * 5.5 mm.

TABLE 10A

Aspheric Constants

| SURFACE | 9 | 17 | 24 | 43 |
|---|---|---|---|---|
| K | 0.000000 | 0.000000 | 0.000000 | 0.000000 |
| C1 | −6.15279430E−08 | −7.45094812E−09 | 2.39757847E−08 | −1.54444107E−08 |
| C2 | 9.07235846E−12 | −4.96869140E−13 | −3.99268761E−13 | 4.80555171E−13 |
| C3 | −7.62016156E−16 | −1.80457306E−17 | 7.58714696E−18 | −6.81317137E−18 |
| C4 | 2.11604502E−20 | 1.21427645E−21 | −4.07907824E−23 | −4.66659168E−22 |
| C5 | 2.96357585E−24 | 5.49372107E−27 | −1.80719028E−26 | 1.24273210E−25 |
| C6 | −3.07533659E−28 | −5.29980296E−30 | 1.56076846E−30 | −9.55749906E−30 |
| C7 | 9.06861666E−33 | 1.87024195E−34 | −4.46650154E−35 | 2.28466028E−34 |
| C8 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 |

| SURFACE | 47 | 48 | 51 | 53 |
|---|---|---|---|---|
| K | 0.000000 | 0.000000 | 0.000000 | 0.000000 |
| C1 | 8.90249656E−08 | 2.76818942E−08 | 1.78760001E−08 | −3.73813506E−08 |
| C2 | −4.45589909E−12 | −1.65762708E−12 | −3.78510161E−13 | −8.19572990E−13 |
| C3 | 3.52161972E−16 | 1.59654730E−17 | −9.90977073E−17 | 1.19684623E−16 |
| C4 | −2.12193214E−20 | −5.50850519E−21 | 4.44216686E−21 | −2.57891394E−21 |
| C5 | 2.64252109E−25 | 5.52122259E−25 | −1.56666224E−25 | −3.00853670E−26 |
| C6 | 1.24505795E−28 | −1.35900754E−28 | 6.86877450E−30 | 1.83635093E−30 |
| C7 | −6.14481041E−33 | 8.92763147E−33 | −1.16755871E−34 | −2.23365868E−35 |
| C8 | 0.00000000E+00 | 0.00000000E+00 | 0.00000000E+00 | 0.00000000E+00 |
| C9 | 0.00000000E+00 | 0.00000000E+00 | 0.00000000E+00 | 0.00000000E+00 |

| SURFACE | 54 | 64 | 66 |
|---|---|---|---|
| K | 0.000000 | 0.000000 | 0.000000 |
| C1 | 1.72819429E−08 | 3.26401527E−08 | −6.53868478E−08 |

TABLE 10A-continued

Aspheric Constants

| | | | |
|---|---|---|---|
| C2 | −6.69013106E−13 | −2.29140025E−12 | −1.10187961E−13 |
| C3 | 1.37958358E−17 | 1.41955877E−16 | −2.52289121E−16 |
| C4 | −5.77392139E−22 | −6.67154130E−21 | 2.78201377E−20 |
| C5 | 1.73608231E−26 | 2.03231717E−25 | −3.07320360E−24 |
| C6 | −3.71846793E−31 | −3.61901511E−30 | 1.72608145E−28 |
| C7 | 6.53070350E−36 | 2.87175589E−35 | −5.63187727E−33 |
| C8 | 0.00000000E+00 | 0.00000000E+00 | 0.00000000E+00 |
| C9 | 0.00000000E+00 | 0.00000000E+00 | 0.00000000E+00 |

What is claimed is:

1. A method, comprising:
exposing an exposure area of a radiation-sensitive substrate arranged in an image surface of a projection objective with at least one image of a pattern of a mask arranged in an object surface of the projection objective in a scanning operation, the scanning operation comprising moving the mask relative to an effective object field of the projection objective in a first scanning direction and simultaneously moving the radiation-sensitive substrate relative to an effective image field of the projection objective in a second scanning direction; and
actively changing imaging properties of the projection objective during the scanning operation according to a time profile to: a) dynamically vary a field curvature of the projection objective during the scanning operation; and b) dynamically vary a distortion of the projection objective during the scanning operation,
wherein:
the projection objective comprises a plurality of mirrors including a folding mirror and a concave mirror;
the folding mirror comprises a reflective surface arranged in a projection beam path of the projection objective at a location that is optically close to a field surface of the projection objective;
the concave mirror comprises a reflective surface arranged in the projection beam path; and
varying the field curvature and the distortion of the projection objective comprises adjusting a surface profile of a reflective surface of a first mirror of the projection objective from a single radius of curvature having a first value in an optically used area prior to adjusting to a single radius of curvature having a second value in the optically used area after the adjusting, to change an optical effect caused by the mirror in a spatially resolved manner, wherein the adjusting results in a single radius of curvature after the adjusting, the second value being different from the first value.

2. The method of claim 1, comprising bending the folding mirror.

3. The method of claim 1, wherein the first mirror is the folding mirror.

4. The method of claim 1, wherein the projection objective further comprises a field element, and the method comprises manipulating the folding mirror and the field element independently of each other.

5. The method of claim 1, wherein the field curvature is changed at a rate that is between 0.5% and 50% of a depth of focus of the projection objective within a one millisecond time interval.

6. The method of claim 1, wherein a direction of change of at least one aberration is changed one or more times during a single scanning operation.

7. The method of claim 1, wherein imaging properties are changed with a frequency of at least 20 Hz.

8. The method of claim 1, further comprising:
generating data representing a surface profile of the radiation-sensitive substrate in the exposure area of the radiation-sensitive substrate;
generating manipulator control signals based on the data; and
driving at least one manipulation device of the projection objective in response to the manipulator control signals to dynamically adapt the imaging properties of the projection objective to reduce imaging aberrations caused by the surface profile in the exposure area of the radiation-sensitive substrate.

9. The method of claim 1, further comprising:
generating data representing a surface profile of the mask in the exposure area of the mask;
generating manipulator control signals based on the data; and
driving at least one manipulation device of the projection objective in response to the manipulator control signals to dynamically adapt the imaging properties of the projection objective to reduce imaging aberrations caused by the surface profile in the exposure area of the mask.

10. The method of claim 1, wherein:
the projection objective further comprises a field element that is a transparent optical element in the projection beam path;
the transparent optical element has an optical surface arranged in the projection beam path of the projection objective optically close to a field surface of the projection objective; and
the method comprises changing a spatial distribution of refractive power in an optically used area of the transparent optical element.

11. A method, comprising:
a) exposing an exposure area of a radiation-sensitive substrate in an image surface of a projection objective with at least one image of a pattern of a mask arranged in an object surface of the projection objective while moving the mask relative to an effective object field of the projection objective in a first direction and simultaneously moving the radiation-sensitive substrate relative to an effective image field of the projection objective in a second direction; and
b) during a), dynamically vary a field curvature of the projection objective and dynamically vary a distortion of the projection objective during the scanning operation,
wherein:
the projection objective comprises a plurality of mirrors including a folding mirror and a concave mirror;
the folding mirror comprises a reflective surface arranged in a projection beam path of the projection objective at a location that is optically close to a field surface of the projection objective;

the concave mirror comprises a reflective surface arranged in the projection beam path; and varying the field curvature and the distortion of the projection objective comprises adjusting a surface profile of a reflective surface of a first mirror of the projection objective from a single radius of curvature having a first value in an optically used area prior to adjusting to a single radius of curvature having a second value in the optically used area after the adjusting, to change an optical effect caused by the first mirror in a spatially resolved manner, wherein the adjusting results in a single radius of curvature after the adjusting, the second value being different from the first value.

12. The method of claim 11, comprising bending the folding mirror.

13. The method of claim 11, wherein the first mirror is the folding mirror.

14. An apparatus, comprising:
an illumination system configured to produce illumination radiation incident on an object bearing a pattern;
a projection objective configured to project an image of the pattern onto a radiation-sensitive substrate;
a scanning system configured to, during a scanning operation, move the object relative to an effective object field of the projection objective in a first direction and to simultaneously move the radiation-sensitive substrate relative to the effective image field of the projection objective in a second direction; and
a control system configured to, during the scanning operation, dynamically vary a field curvature of the projection objective and dynamically vary a distortion of the projection objective during the scanning operation,
wherein:
the projection objective comprises a plurality of mirrors including a folding mirror and a concave mirror;
the folding mirror comprises a reflective surface arranged in a projection beam path of the projection objective at a location that is optically close to a field surface of the projection objective;
the concave mirror comprises a reflective surface arranged in the projection beam path; and
the projection objective comprises a device configured to adjust a surface profile of a reflective surface of a first mirror of the projection objective from a single radius of curvature having a first value in an optically used area prior to adjusting to a single radius of curvature having a second value in the optically used area after the adjusting, to change an optical effect caused by the first mirror in a spatially resolved manner, wherein the adjusting results in a single radius of curvature after the adjusting, the second value being different from the first value, thereby varying the field curvature and the distortion of the projection objective.

15. The apparatus of claim 14, wherein the device is configured to bend the folding mirror.

16. The apparatus of claim 14, wherein the first mirror is the folding mirror.

17. The apparatus of claim 14, wherein the projection objective comprises:
a first objective part configured to image the pattern provided in the object surface into a first intermediate image;
a second objective part configured to image the first intermediate image into a second intermediate image, the second objective part comprising the concave mirror which is situated at a second pupil surface;
a third objective part configured to image the second intermediate image onto the image surface,
wherein:
the folding mirror is arranged optically close to the first intermediate image such that the folding mirror can reflect radiation coming from the object surface in the direction of the concave mirror; and
the projection objective comprises a further folding mirror arranged optically close to the second intermediate image such that the further folding mirror can reflect radiation coming from the concave mirror in the direction of the image surface.

18. The apparatus of claim 17, wherein each of the folding mirrors is associated with a manipulation device, and the manipulation devices are configured to change the surface profiles of the folding mirrors in a prescribed coordinated manner independently of each other.

19. The apparatus of claim 14, further comprising a device configured to determine a topography of the radiation-sensitive substrate prior to varying the field curvature of the projection objective.

20. The apparatus of claim 19, wherein determining a topography of the radiation-sensitive substrate comprises determining an amount of deviation from a planar reference surface, the planar reference surface being perpendicular to an optical axis of the projection objective.

* * * * *